(12) United States Patent  
Kim et al.

(10) Patent No.: US 10,361,322 B2  
(45) Date of Patent: Jul. 23, 2019

(54) SOLAR CELL MODULE

(71) Applicant: LG ELECTRONICS INC., Seoul (KR)

(72) Inventors: Bojoong Kim, Seoul (KR); Minpyo Kim, Seoul (KR); Daeseon Hyun, Seoul (KR); Hyunjung Park, Seoul (KR); Ahreum Lee, Seoul (KR); Youshin Han, Seoul (KR); Youngdo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 369 days.

(21) Appl. No.: 15/288,220

(22) Filed: Oct. 7, 2016

(65) Prior Publication Data

US 2017/0104114 A1    Apr. 13, 2017

(30) Foreign Application Priority Data

Oct. 8, 2015  (KR) .................. 10-2015-0141357  
May 3, 2016  (KR) .................. 10-2016-0054659  
Sep. 9, 2016  (KR) .................. 10-2016-0116216

(51) Int. Cl.  
*H01L 31/0224* (2006.01)  
*H01L 31/05* (2014.01)  
H01L 31/068 (2012.01)  
*H01L 31/0745* (2012.01)

(52) U.S. Cl.  
CPC .. *H01L 31/022441* (2013.01); *H01L 31/0504* (2013.01); *H01L 31/0508* (2013.01);  
(Continued)

(58) Field of Classification Search  
CPC ......... H01L 31/022441; H01L 31/0504; H01L 31/0508; H01L 31/0745  
See application file for complete search history.

(56) References Cited

U.S. PATENT DOCUMENTS

2011/0073154 A1  3/2011  Nishida  
2011/0073165 A1  3/2011  Lee  
(Continued)

FOREIGN PATENT DOCUMENTS

CN   104868004 A   8/2015  
CN   104868012 A   8/2015  
(Continued)

*Primary Examiner* — Tae-Sik Kang  
(74) *Attorney, Agent, or Firm* — Birch, Stewart, Kolasch & Birch, LLP

(57) ABSTRACT

A solar cell module includes a plurality of solar cells each including a semiconductor substrate and first electrodes and second electrodes extended on a back surface of the semiconductor substrate, first conductive lines connected to the first electrodes at crossings between the first electrodes and the first conductive lines through first conductive adhesive layers, second conductive lines connected to the second electrodes at crossings between the second electrodes and the second conductive lines through the first conductive adhesive layers, and an intercell connector extended between a first solar cell and a second solar cell that are adjacent to each other. The first conductive lines connected to the first solar cell and the second conductive lines connected to the second solar cell are commonly connected to the intercell connector.

27 Claims, 31 Drawing Sheets

(52) U.S. Cl.
CPC ...... *H01L 31/0516* (2013.01); *H01L 31/0682* (2013.01); *H01L 31/0745* (2013.01); *Y02E 10/547* (2013.01)

(56) References Cited

U.S. PATENT DOCUMENTS

| | | |
|---|---|---|
| 2013/0037079 A1 | 2/2013 | Hishida et al. |
| 2013/0213452 A1 | 8/2013 | Ide et al. |
| 2013/0240022 A1* | 9/2013 | Sewell ............ H01L 31/022441 136/251 |
| 2013/0312826 A1 | 11/2013 | Narita et al. |
| 2014/0370650 A1* | 12/2014 | Moslehi .................. H01L 31/18 438/98 |
| 2015/0243798 A1 | 8/2015 | Woo |

FOREIGN PATENT DOCUMENTS

| | | |
|---|---|---|
| EP | 2575183 A2 | 4/2013 |
| EP | 2657981 A1 | 10/2013 |
| EP | 2843710 A1 | 3/2015 |
| JP | 2-235379 A | 9/1990 |
| JP | 2005-11869 A | 1/2005 |
| JP | 2006-59991 A | 3/2006 |
| JP | 2008-135652 A | 6/2008 |
| JP | 2011-77130 A | 4/2011 |
| JP | 2011-249446 A | 12/2011 |
| JP | 2012-23412 A | 2/2012 |
| JP | 2012-74414 A | 4/2012 |
| JP | 2012-109626 A | 6/2012 |
| JP | 2012-182168 A | 9/2012 |
| JP | 2014-17525 A | 1/2014 |
| JP | 2015-159287 A | 9/2015 |
| KR | 10-1223050 B1 | 1/2013 |
| KR | 10-2015-0049192 A | 5/2015 |
| KR | 10-2015-0100146 A | 9/2015 |
| KR | 10-2015-0145148 A | 12/2015 |
| WO | WO 2007/099955 A1 | 9/2007 |
| WO | WO 2014/174836 A1 | 10/2014 |

* cited by examiner (a)

(b)

SOLAR CELL MODULE

CROSS-REFERENCE TO RELATED APPLICATION

This application claims priority to and the benefit of Korean Patent Application No. 10-2015-0141357 filed in the Korean Intellectual Property Office on Oct. 8, 2015, No. 10-2016-0054659 filed on May 3, 2016 and No. 10-2016-0116216 filed on Sep. 9, 2016, the entire contents of which are incorporated herein by reference.

BACKGROUND OF THE INVENTION

Field of the Invention

Embodiments of the invention relate to a solar cell module.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration may be connected to one another through intercell connectors to form a module.

In a back contact solar cell, in which all of electrodes are connected to a back surface, metal wires may be connected to electrodes positioned on a back surface of a semiconductor substrate through a first conductive adhesive layer and may be connected to an intercell connector between solar cells.

In a structure, in which metal wires are connected to a back surface of a solar cell, when a completed solar cell module is installed in a field and operates, the solar cell module may be affected by the seasons, the weather, or an installation position and exposed to an environment, in which a high temperature and a low temperature are continuously repeated.

In this instance, a temperature inside the solar cell module continuously repeats or reflects the high temperature and the low temperature. Hence, the metal wires may be thermally expanded or thermally contracted, and the metal wires and the electrodes of the solar cell may be disconnected from each other. Further, a physical adhesive strength between the metal wires and the intercell connector may be reduced, and the intercell connector may bend.

Further, when a plurality of conductive lines are connected to the intercell connector, the conductive lines are thermally expanded during a thermal process due to the thermal expansion of the metal wires. The intercell connector is deformed because of a shear stress of the conductive lines, and the conductive lines and the intercell connector are disconnected from each other.

SUMMARY OF THE INVENTION

In one aspect, there is provided a solar cell module including a plurality of solar cells arranged to be spaced apart from one another in a first direction, each solar cell including a semiconductor substrate and a plurality of first electrodes and a plurality of second electrodes extended on a back surface of the semiconductor substrate in a second direction crossing the first direction; a plurality of first conductive lines and a plurality of second conductive lines extended on the back surface of the semiconductor substrate of each solar cell in the first direction, the plurality of first conductive lines being connected to the plurality of first electrodes at crossings between the plurality of first electrodes and the plurality of first conductive lines through a plurality of first conductive adhesive layers, the plurality of second conductive lines being connected to the plurality of second electrodes at crossings between the plurality of second electrodes and the plurality of second conductive lines through the plurality of first conductive adhesive layers; and an intercell connector extended between a first solar cell and a second solar cell that are disposed adjacent to each other among the plurality of solar cells, in the second direction, the plurality of first conductive lines connected to the first solar cell and the plurality of second conductive lines connected to the second solar cell being commonly connected to the intercell connector through a second conductive adhesive layer, wherein at least one of the plurality of first conductive adhesive layers, the plurality of first conductive lines, the plurality of second conductive lines, and the intercell connector has an asymmetric pattern.

For example, as at least some of the plurality of first conductive adhesive layers go along a longitudinal direction of the first and second conductive lines, the at least some first conductive adhesive layers may have an asymmetric pattern based on a central line of each of the first and second conductive lines.

More specifically, each first conductive adhesive layer may include first and second edges respectively positioned at both ends in the second direction. The first edge of each of the at least some first conductive adhesive layers may be positioned inside an overlap area between the first and second conductive lines and the at least some first conductive adhesive layers, and the second edge of each of the at least some first conductive adhesive layers may be positioned outside the overlap area.

For example, as the at least some first conductive adhesive layers go along the longitudinal direction of the first and second conductive lines, the at least some first conductive adhesive layers may be disposed in a zigzag shape based on the central line of each of the first and second conductive lines.

A second direction length of each of the at least some first conductive adhesive layers may be less than a linewidth of each of the first and second conductive lines. A first direction width of each of the at least some first conductive adhesive layers may be less than the second direction length of the first conductive adhesive layer.

A second direction length of remaining first conductive adhesive layers except the at least some first conductive adhesive layers from the plurality of first conductive adhesive layers may be greater than the linewidth of each of the first and second conductive lines. Both edges of each of the remaining first conductive adhesive layers in the second direction may be positioned outside an overlap area between the first and second conductive lines and the remaining first conductive adhesive layers.

The at least some first conductive adhesive layers and the remaining first conductive adhesive layers may be alternately positioned along the longitudinal direction of the first and second conductive lines.

For example, the remaining first conductive adhesive layers may be positioned in an edge portion of the semiconductor substrate. The at least some first conductive adhesive layers may be positioned in a middle portion of the semiconductor substrate.

Each of the first and second conductive lines may be asymmetric with respect to both sides of a first direction central axis of each of the first and second conductive lines.

The first conductive line may have a uniform linewidth and have an asymmetric shape with respect to both sides of the first direction central axis of the first conductive line. The second conductive line may have a uniform linewidth and have an asymmetric shape with respect to both sides of the first direction central axis of the second conductive line.

For example, each of the first and second conductive lines may have a zigzag shape with respect to both sides of the first direction central axis of each of the first and second conductive lines.

In this instance, each of the first and second conductive lines having the zigzag shape may include a hole.

Each of the first and second conductive lines may include a hole, and a position or a shape of the hole may be asymmetric based on the first direction central axis.

A width of each of the first and second conductive lines may periodically increase or decrease along the first direction.

The first conductive line may be connected to the first electrode at a crossing between the first conductive line and the first electrode through the first conductive adhesive layer and may be insulated from the second electrode at a crossing between the first conductive line and the second electrode through an insulating layer. The second conductive line may be connected to the second electrode at a crossing between the second conductive line and the second electrode through the first conductive adhesive layer and may be insulated from the first electrode at a crossing between the second conductive line and the first electrode through the insulating layer.

An end of each of the first and second conductive lines protruding to the outside of a projection area of the semiconductor substrate may include a portion bending in a third direction crossing the first and second directions.

The bending portion of each of the first and second conductive lines may be positioned between the semiconductor substrate of each of the first and second solar cells and the intercell connector.

The bending portion of each of the first and second conductive lines may protrude toward a back surface of the solar cell module.

A planar shape of the intercell connector may have an asymmetric shape based on a central line of the intercell connector parallel to the second direction.

A first connection portion between the first conductive line connected to the first solar cell and the intercell connector and a second connection portion between the second conductive line connected to the second solar cell and the intercell connector may be alternately positioned on the intercell connector along the second direction corresponding to a longitudinal direction of the intercell connector. The intercell connector may have an asymmetric shape based on the central line in the first connection portion and have an asymmetric shape based on the central line in the second connection portion.

The planar shape of the intercell connector may have at least one of a slit, a hole, a protrusion, a depression, or a zigzag shape, each of which is formed asymmetrically based on the central line.

For example, the planar shape of the intercell connector may have the zigzag shape. The zigzag shape of the intercell connector may be configured such that one side of the intercell connector protrudes based on the central line and the other side is depressed based on the central line when viewed from the plan of the intercell connector.

A first side of the intercell connector of the zigzag shape next to the first solar cell in the first connection portion may protrude toward the first solar cell, and a second side of the intercell connector next to the second solar cell may be depressed toward the central line. The second side of the intercell connector in the second connection portion may protrude toward the second solar cell, and the first side of the intercell connector may be depressed toward the central line.

The planar shape of the intercell connector may have the protrusion and/or the depression which is formed asymmetrically based on the central line. The protrusion may be formed on a first side of the intercell connector in the first connection portion, and the protrusion may not be formed or the depression may be formed on a second side of the intercell connector corresponding to the first connection portion. The protrusion may be formed on the second side of the intercell connector in the second connection portion, and the protrusion may not be formed or the depression may be formed on the first side of the intercell connector corresponding to the second connection portion.

The planar shape of the intercell connector may have the depression which is formed asymmetrically based on the central line. The depression may be formed on a second side of the intercell connector corresponding to the first connection portion, and the depression may not be formed on a first side symmetric with the second side. The depression may be formed on the first side of the intercell connector corresponding to the second connection portion, and the depression may not be formed on the second side.

The planar shape of the intercell connector may have the slit or the hole which is formed asymmetrically based on the central line. The slit or the hole may be formed in a portion adjacent to a first side of the intercell connector based on the central line in the first connection portion and may not be formed in a portion adjacent to a second side of the intercell connector based on the central line. The slit or the hole may be formed in a portion adjacent to the second side of the intercell connector based on the central line in the second connection portion and may not be formed in a portion adjacent to the first side of the intercell connector based on the central line.

The semiconductor substrate of each of the first and second solar cells may be doped with impurities of a first conductive type. The first electrode may be positioned on the back surface of the semiconductor substrate and may be connected to an emitter region, that is doped with impurities of a second conductive type opposite the first conductive type. The second electrode may be positioned on the back surface of the semiconductor substrate and may be connected to a back surface field region, that is more heavily doped than the semiconductor substrate with impurities of the first conductive type.

In another aspect, there is provided a solar cell module including a plurality of solar cells each including a semiconductor substrate, and a plurality of first electrodes and a plurality of second electrodes having different polarities and being extended on the semiconductor substrate in a second direction; a plurality of first conductive lines and a plurality of second conductive lines connected to each solar cell and extended in a first direction crossing the plurality of first electrodes and the plurality of second electrodes, the plurality of first conductive lines being connected to the plurality of first electrodes while overlapping the plurality of first electrodes, the plurality of second conductive lines being connected to the plurality of second electrodes while overlapping the plurality of second electrodes; and an intercell connector extended between a first solar cell and a second solar cell that are disposed adjacent to each other among the plurality of solar cells, in the second direction, the plurality of first conductive lines connected to the first solar cell and the plurality of second conductive lines connected to the second solar cell being commonly connected to the intercell connector, wherein the intercell connector is spaced apart from the semiconductor substrate of each of the first solar cell and the second solar cell, and wherein a distance between a first side of the intercell connector positioned on the same line as a connection portion of the intercell connector, to which one of the first and second conductive lines connected to the first and second solar cells is connected, and the semiconductor substrate of the first solar cell is different from a distance between a second side of the intercell connector positioned opposite the first side and the semiconductor substrate of the second solar cell.

A first connection portion of the intercell connector, to which the first conductive line of the first solar cell is connected, may be positioned closer to the distance between the first side of the intercell connector and the semiconductor substrate of the first solar cell than the distance between the second side of the intercell connector and the semiconductor substrate of the second solar cell. A second connection portion of the intercell connector, to which the second conductive line of the second solar cell is connected, may be positioned closer to the distance between the second side of the intercell connector and the semiconductor substrate of the second solar cell than the distance between the first side of the intercell connector and the semiconductor substrate of the first solar cell.

In yet another aspect, there is provided a solar cell module including a plurality of solar cells arranged to be spaced apart from one another in a first direction, each solar cell including a semiconductor substrate and a plurality of first electrodes and a plurality of second electrodes extended on a back surface of the semiconductor substrate in a second direction crossing the first direction; and a plurality of first conductive lines and a plurality of second conductive lines extended on the back surface of the semiconductor substrate of each solar cell in the first direction, the plurality of first conductive lines being connected to the plurality of first electrodes at crossings between the plurality of first electrodes and the plurality of first conductive lines through a plurality of first conductive adhesive layers, the plurality of second conductive lines being connected to the plurality of second electrodes at crossings between the plurality of second electrodes and the plurality of second conductive lines through the plurality of first conductive adhesive layers, wherein each first conductive adhesive layer includes first and second edges respectively positioned at both ends in the second direction, and wherein the first edge of each of at least some of the plurality of first conductive adhesive layers is positioned inside an overlap area between the plurality of first conductive lines and the plurality of second conductive lines with the at least some first conductive adhesive layers, and the second edge of each of the at least some first conductive adhesive layers is positioned outside the overlap area.

Each of the at least some first conductive adhesive layers may be divided in the second direction at a crossing between the first electrode and the first conductive line and a crossing between the second electrode and the second conductive line to form a plurality of first conductive adhesive layers.

The first edge of each of the plurality of first conductive adhesive layers, that are spaced apart from one another in the second direction at the crossing between the first electrode and the first conductive line and the crossing between the second electrode and the second conductive line, may be positioned inside an overlap area between the first and second conductive lines and the first conductive adhesive layers, and the second edge of each first conductive adhesive layer may be positioned outside the overlap area.

A separate first conductive adhesive layer may be positioned between the plurality of first conductive adhesive layers, that are spaced apart from one another in the second direction at the crossing between the first electrode and the first conductive line and the crossing between the second electrode and the second conductive line, and may be spaced apart from the plurality of first conductive adhesive layers. Both edges of the separate first conductive adhesive layer may be positioned inside the overlap area.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
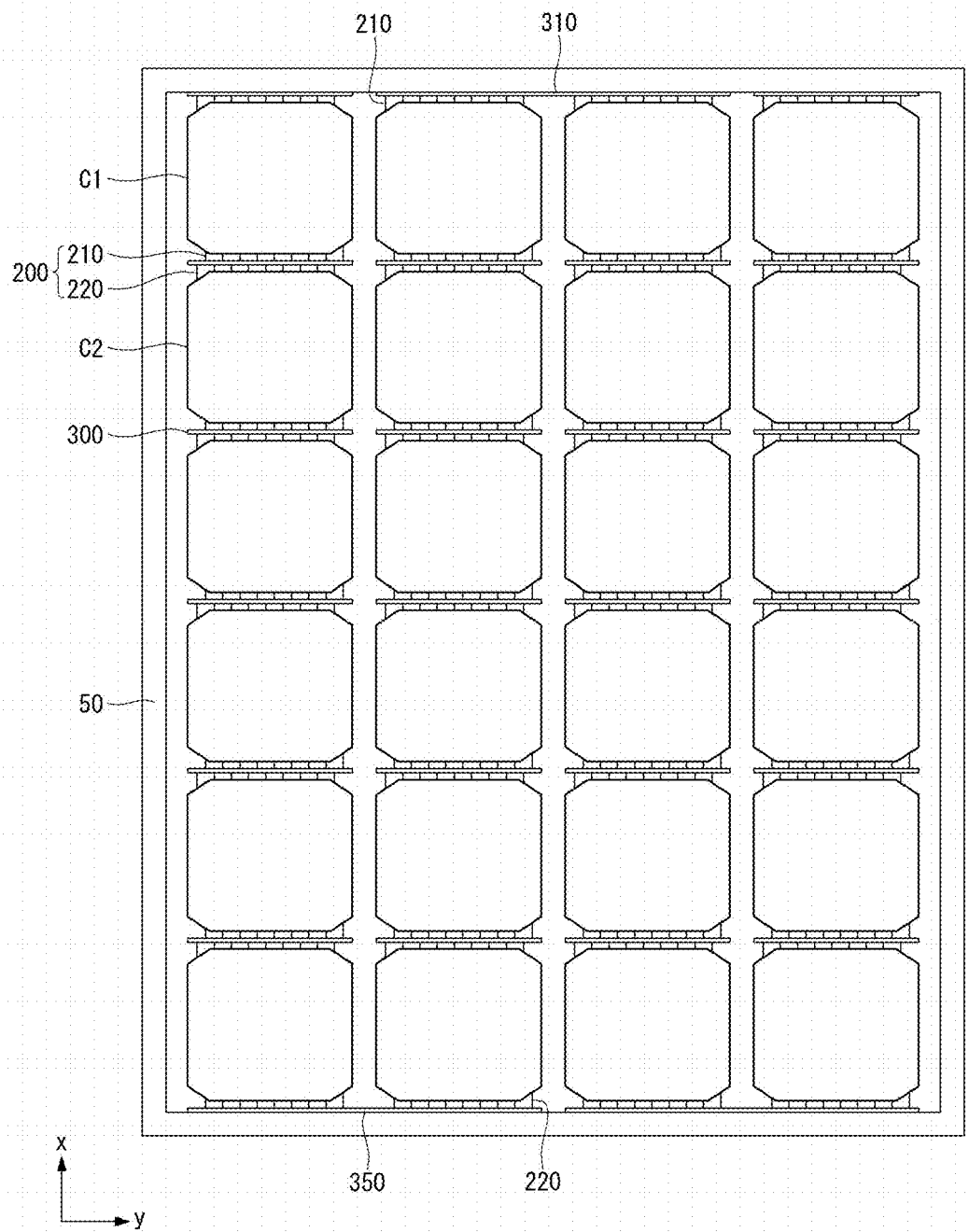
FIG. 1 is a plane view illustrating an entire front surface of a solar cell module according to an embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" of a component may be one surface of a module, on which light is directly incident, and "back surface" of a component may be a surface opposite the one surface of the module, on which light is not directly incident or reflective light may be incident.

In the following description, a cell string indicates a structure or a shape, in which a plurality of solar cells are connected in series to one another.

In the following description, the fact that a thickness or a width of a component is equal to a thickness or a width of another component indicates that they have the same value within a margin of error of 10% including a process error.

Figure 2:
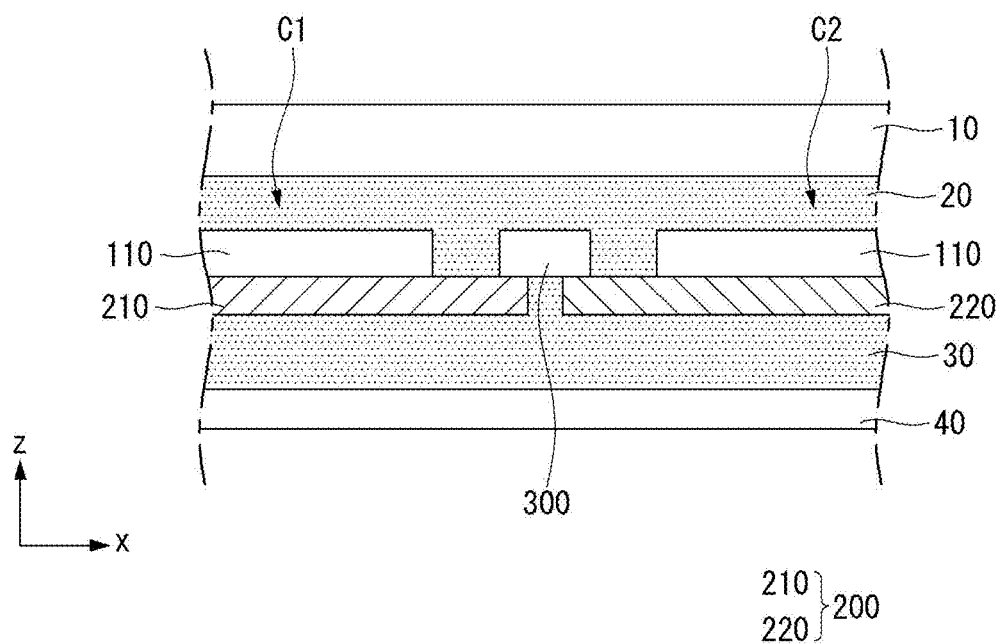
FIG. 2 is a cross-sectional view schematically illustrating first and second solar cells, that are adjacent to each other in a first direction and are connected by an intercell connector.

FIG. 1 is a plane view illustrating an entire front surface of a solar cell module according to an embodiment of the invention. FIG. 2 is a cross-sectional view schematically illustrating first and second solar cells, that are adjacent to each other in a first direction and are connected by an intercell connector.

As shown in FIGS. 1 and 2, a solar cell module according to an embodiment of the invention may include a plurality of solar cells, a plurality of first and second conductive lines 200, and an intercell connector 300.

In addition, the solar cell module according to the embodiment of the invention may further include and a front transparent substrate 10, encapsulants 20 and 30, a back sheet 40, and a frame 50 for encapsulating a cell string formed by connecting the plurality of solar cells in series.

Each solar cell may include a semiconductor substrate 110 and a plurality of first and second electrodes 141 and 142 on a back surface of the semiconductor substrate 110.

As shown in FIGS. 1 and 2, the plurality of first and second conductive lines 200 may be connected to a back surface of each solar cell.

As shown in FIGS. 1 and 2, the plurality of solar cells, to which the plurality of first and second conductive lines 200 are connected, may be connected in series to each other in a first direction x by the intercell connector 300.

For example, the intercell connector 300 may connect in series first and second solar cells C1 and C2, that are positioned adjacent to each other in the first direction x among the plurality of solar cells.

In this instance, as shown in FIG. 2, front surfaces of a plurality of first conductive lines 210 connected to the first solar cell C1 and front surfaces of a plurality of second conductive lines 220 connected to the second solar cell C2 may be connected to a back surface of the intercell connector 300. Hence, the plurality of solar cells C1 and C2 may be connected in series to form a cell string.

As shown in FIG. 2, the cell string, that is disposed between the front transparent substrate 10 and the back sheet 40, may be thermally pressed and laminated.

For example, a lamination process simultaneously applying heat and pressure may be performed in a state where the plurality of solar cells C1 and C2 are disposed between the front transparent substrate 10 and the back sheet 40, and the encapsulants 20 and 30 of a transparent material (for example, an ethylene vinyl acetate (EVA) sheet) are disposed on the front surfaces and the back surfaces of the plurality of solar cells C1 and C2. Hence, the components may be integrated and encapsulated.

As shown in FIG. 1, edges of the front transparent substrate 10, the encapsulants 20 and 30, and the back sheet 40, that are encapsulated through the lamination process, may be fixed and protected by the frame 50.

Accordingly, as shown in FIG. 1, the plurality of solar cells, the plurality of first and second conductive lines 200, the intercell connector 300, the back sheet 40, and the frame 50 may be seen from a front surface of the solar cell module by penetrating the front transparent substrate 10 and the encapsulants 20 and 30.

Each cell string may extend in the first direction x. The plurality of cell strings may be spaced apart from one another in a second direction y and may be connected in series to one another in the second direction y by a bushing bar 310 extending in the second direction y.

The front transparent substrate 10 may be formed of a tempered glass, etc. having a high transmittance and an excellent damage prevention function.

The back sheet 40 can prevent moisture and oxygen from penetrating into the back surfaces of the solar cells C1 and C2 and protect the solar cells C1 and C2 from an external environment. The back sheet 40 may have a multi-layered structure including a moisture/oxygen penetrating prevention layer, a chemical corrosion prevention layer, etc.

The back sheet 40 may be formed as a thin sheet formed of an insulating material, such as fluoropolymer/polyester/fluoropolymer (FP/PE/FP). Insulating sheets formed of other insulating materials may be used in the back sheet 40.

The lamination process may be performed in a state where the sheet-shaped encapsulants 20 and 30 are respectively disposed between the front transparent substrate 10 and the solar cells C1 and C2 and between the solar cells C1 and C2 and the back sheet 40.

Figure 3:
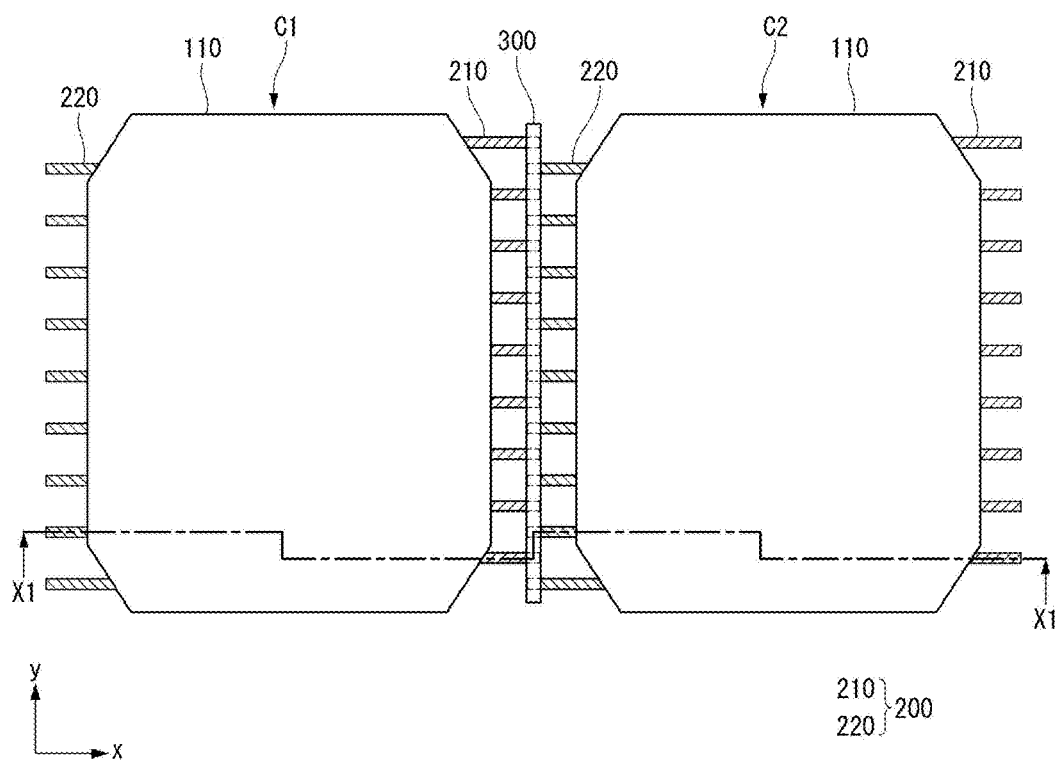
FIGS. 3 to 5 illustrate in detail a serial connection structure of first and second solar cells.

In the embodiment disclosed herein, the encapsulants 20 and 30 may be formed of a material different from a material of an insulating layer IL of FIG. 3. The encapsulants 20 and 30 may be formed of a material (for example, ethylene vinyl acetate (EVA)) capable of preventing a corrosion resulting from moisture penetration and absorbing an impact to protect the solar cells C1 and C2 from the impact.

The sheet-shaped encapsulants 20 and 30 disposed between the front transparent substrate 10 and the solar cells C1 and C2 and between the solar cells C1 and C2 and the back sheet 40 may be softened and cured by heat and pressure during the lamination process.

Hereinafter, a structure of the solar cell module shown in FIGS. 1 and 2, in which the plurality of solar cells are connected in series by the conductive lines 200 and the intercell connector 300, is described in detail.

Figure 4:
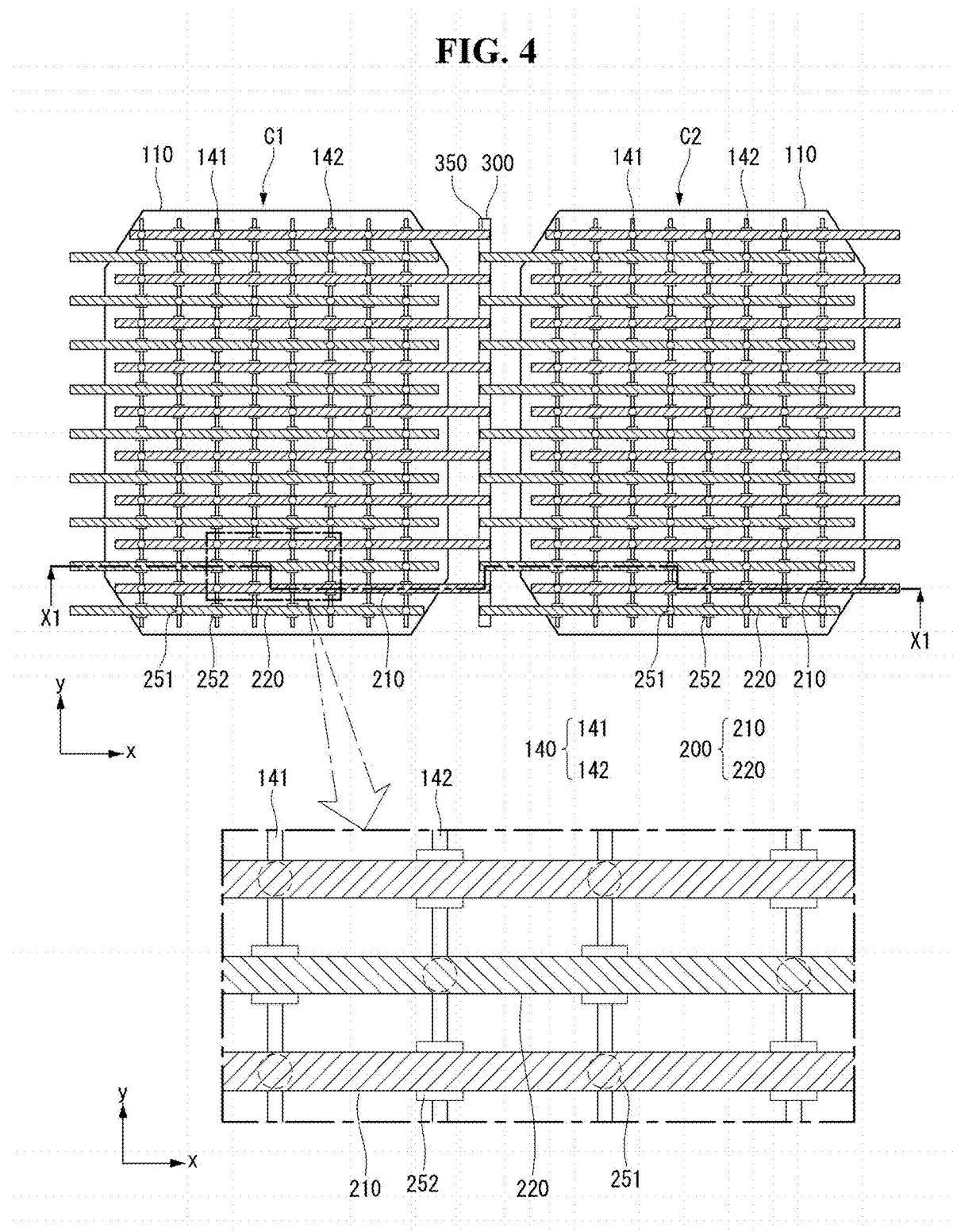
Figure 5:
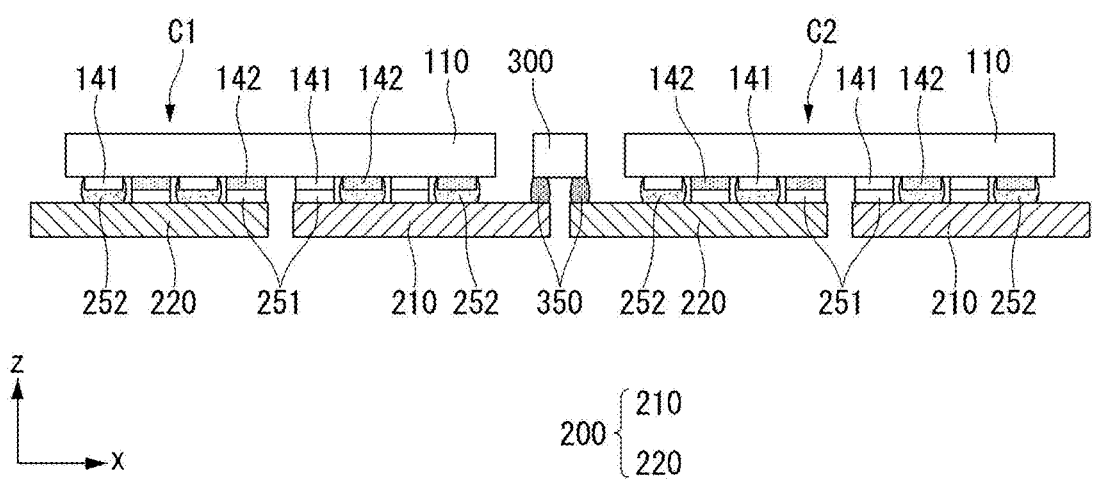

FIGS. 3 to 5 illustrate in detail a serial connection structure of first and second solar cells.

More specifically, FIG. 3 illustrates front surfaces of first and second solar cells that are adjacent to each other in the first direction and are connected by an intercell connector. FIG. 4 illustrates back surfaces of first and second solar cells shown in FIG. 3. FIG. 5 is a cross-sectional view taken along line X1-X1 of FIGS. 3 and 4.

As shown in FIGS. 3 and 4, in the solar cell module according to the embodiment of the invention, a plurality of first and second conductive lines 200 may be connected to back surfaces of semiconductor substrates 110 included in first and second solar cells C1 and C2.

The first and second solar cells C1 and C2 may be arranged to be spaced apart from each other in the first direction x. As shown in FIG. 4, each of the first and second solar cells C1 and C2 may at least include the semiconductor substrate 110 and a plurality of first and second electrodes 141 and 142 that are spaced apart from each other on a back surface of the semiconductor substrate 110 and extend in the second direction y crossing the first direction x.

The plurality of first and second conductive lines 200 may be disposed to extend in an arrangement direction (i.e., the first direction x) of the first and second solar cells C1 and C2 and may be connected to each of the first and second solar cells C1 and C2.

The plurality of first and second conductive lines 200 may include a plurality of first conductive lines 210 that cross and overlap the plurality of first electrodes 141 included in each of the first and second solar cells C1 and C2 and are connected to the first electrodes 141, and a plurality of second conductive lines 220 that cross and overlap the plurality of second electrodes 142 included in each of the first and second solar cells C1 and C2 and are connected to the second electrodes 142.

More specifically, the first conductive lines 210 may be connected to the first electrodes 141 in a portion crossing the first electrodes 141 included in each of the plurality of solar cells C1 and C2 through a first conductive adhesive layer 251 formed of a conductive material and may be insulated from the second electrodes 142 in a portion crossing the second electrodes 142 through an insulating layer 252 formed of an insulating material.

Further, the second conductive lines 220 may be connected to the second electrodes 142 in a portion crossing the second electrodes 142 included in each of the plurality of solar cells C1 and C2 through a first conductive adhesive layer 251 and may be insulated from the first electrodes 141 in a portion crossing the first electrodes 141 through an insulating layer 252.

Each of the first and second conductive lines 200 may be formed of a conductive metal material and may include a conductive core and a conductive coating layer coating a surface of the conductive core.

The coating layer may be formed of Sn-containing alloy and may include at least one of SnPb, Sn, Ag, or SnBiAg.

One end connected to the intercell connector 300 among both ends of the first conductive line 210 may include a protrusion protruding to the outside of a first side of the semiconductor substrate 110. One end connected to the intercell connector 300 among both ends of the second conductive line 220 may include a protrusion protruding to the outside of a second side of the semiconductor substrate 110.

In the embodiment disclosed herein, the first and second sides of the semiconductor substrate 110 are opposite sides of the semiconductor substrate 110 and are sides extending in a direction parallel to the second direction crossing a longitudinal direction of the first and second conductive lines 210 and 220 among four sides of the semiconductor substrate 110.

Hence, one end of a protrusion of each of the first and second conductive lines 210 and 220 protruding to the outside of a projection area of the semiconductor substrate 110 may be connected to the intercell connector 300. The other end of the protrusion of each of the first and second conductive lines 210 and 220 may be positioned inside the projection area of the semiconductor substrate 110.

Each of the first and second conductive lines 200 may have a conductive wire shape having a circular cross section or a ribbon shape, in which a width is greater than a thickness.

A linewidth of each conductive line 200 shown in FIGS. 4 and 5 may be 0.5 mm to 2.5 mm in consideration of a reduction in the manufacturing cost while maintaining a line resistance of the conductive line 200 at a sufficiently low level. A distance between the first and second conductive lines 210 and 220 may be 4 mm to 6.5 mm in consideration of a total number of conductive lines 200, so that a short circuit current of the solar cell module is not damaged.

The number of each of the first and second conductive lines 210 and 220 connected to one solar cell may be 10 to 20. Thus, a sum of the number of first and second conductive lines 210 and 220 connected to one solar cell may be 20 to 40.

The first conductive adhesive layer 251 may be formed of a conductive metal material. The first conductive adhesive layer 251 may be formed as one of a solder paste, an epoxy solder paste, and a conductive paste.

The solder paste layer may be formed of tin (Sn) or Sn-containing alloy, and an epoxy solder paste layer may be formed of Sn or Sn-containing alloy included in an epoxy.

A structure of the first conductive adhesive layer 251 is described in detail with reference to figures subsequent to FIG. 9.

The insulating layer 252 may be made of any material as long as an insulating material is used. For example, the insulating layer 252 may use one insulating material of an epoxy-based resin, polyimide, polyethylene, an acrylic-based resin, and a silicon-based resin.

One end of each of the first and second conductive lines 200 may be connected to the intercell connector 300 and may connect the plurality of solar cells in series.

More specifically, the intercell connector 300 may be positioned between the first and second solar cells C1 and C2 and may extend in the second direction y.

As shown in FIGS. 3 and 4, the intercell connector 300 may be spaced apart from the semiconductor substrate 110 of the first solar cell C1 and the semiconductor substrate 110 of the second solar cell C2 when viewed from the plane of the solar cell.

One end of the first conductive line 210 connected to the first electrode 141 of the first solar cell C1 and one end of the second conductive line 220 connected to the second electrode 142 of the second solar cell C2 may be commonly connected to the intercell connector 300. The first and second solar cells C1 and C2 may be connected in series to each other in the first direction x.

More specifically, as shown in FIG. 5, the first and second solar cells C1 and C2, that are arranged in the first direction x as described above, may extend in the first direction x and may be connected in series to each other through the first and second conductive lines 200 and the intercell connector 300 to form a string.

For example, as shown in FIG. 5, one end of each of the first and second conductive lines 200 may overlap the intercell connector 300 and may be attached to the intercell connector 300 through a second conductive adhesive layer 350.

The second conductive adhesive layer 350 attaching the first and second conductive lines 200 to the intercell connector 300 may be formed of a metal material including tin (Sn) or Sn-containing alloy.

More specifically, the second conductive adhesive layer 350 may be formed of a solder paste including Sn or Sn-containing alloy, an epoxy solder paste in which Sn or Sn-containing alloy is included in an epoxy, or a conductive paste. A melting point of the second conductive adhesive layer 350 may be higher than a melting point of the first conductive adhesive layer 251.

Because the solar cell module having the above-described structure includes the separate intercell connector 300, when a bad connection between the first and second conductive lines 200 and the first and second electrodes 141 and 142 is generated among the plurality of solar cells, the first and second conductive lines 200 of a solar cell having the bad connection may be disconnected from the intercell connector 300. Hence, only the bad solar cell can be easily replaced.

So far, the embodiment of the invention described the structure of the solar cell module, in which the first and second conductive lines 200 are connected to the back surface of each of the first and second solar cells C1 and C2, and the first and second solar cells C1 and C2 are connected in series to each other.

However, the solar cell module according to the embodiment of the invention is not limited to the structure in which the adjacent first and second solar cells are connected in series through the intercell connector. The embodiment of the invention may be applied to a structure, in which the first conductive lines of the first solar cell and the second conductive lines of the second solar cell overlap each other and are connected to each other using the second conductive adhesive layer in a state where the intercell connector is omitted.

A detailed structure of a solar cell applicable to the first and second solar cells C1 and C2 is described below.

Figure 6:
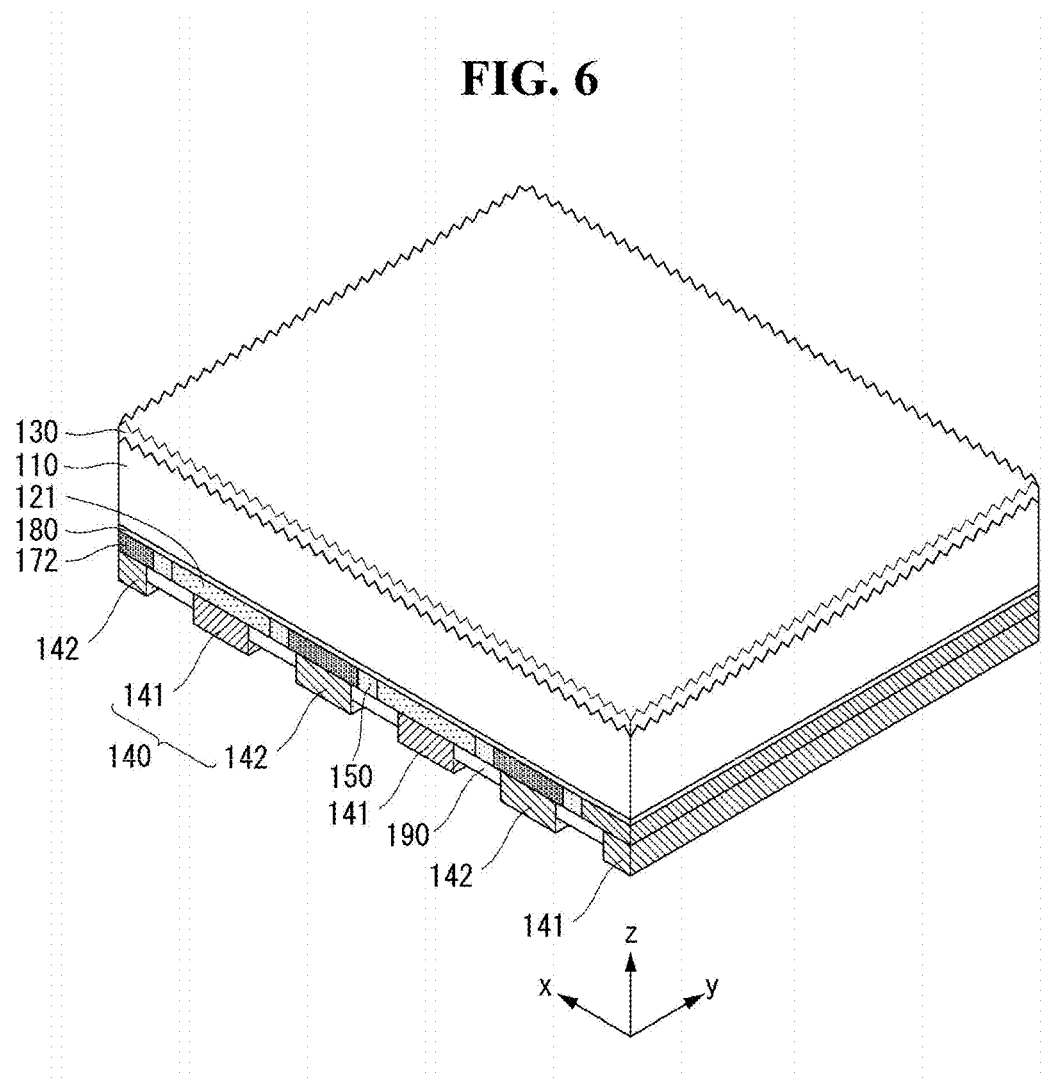
FIGS. 6 to 8 illustrate an example of a solar cell applied to an embodiment of the invention.
Figure 7:
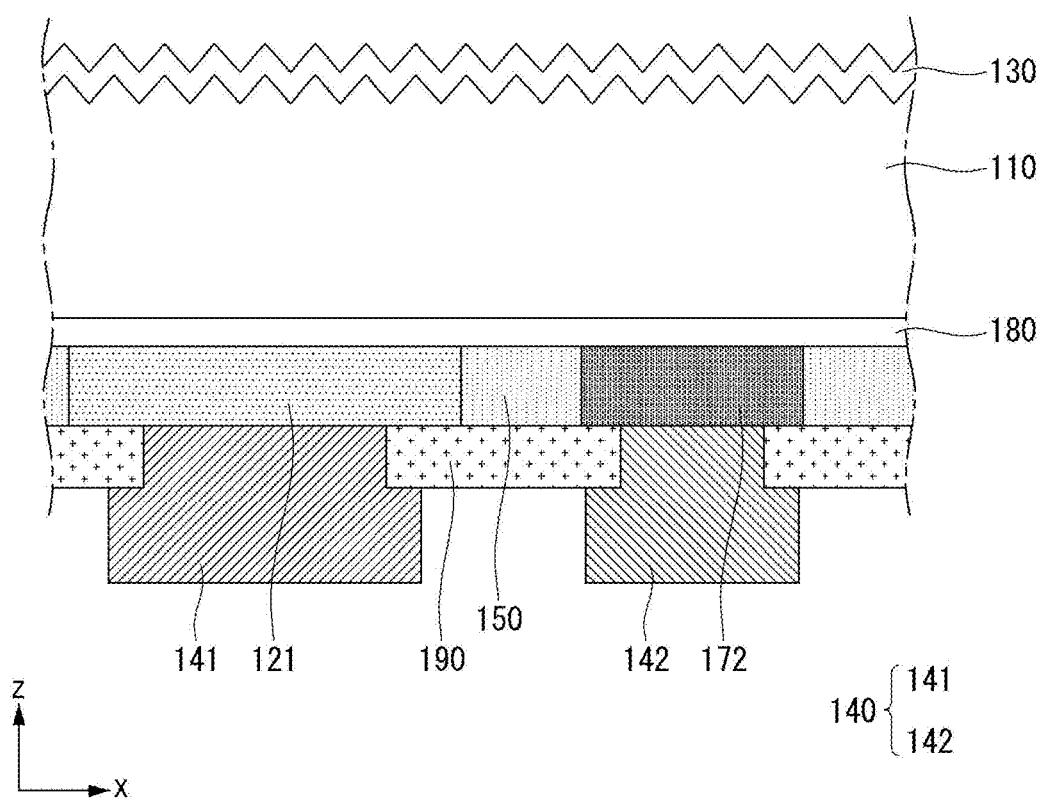
Figure 8:
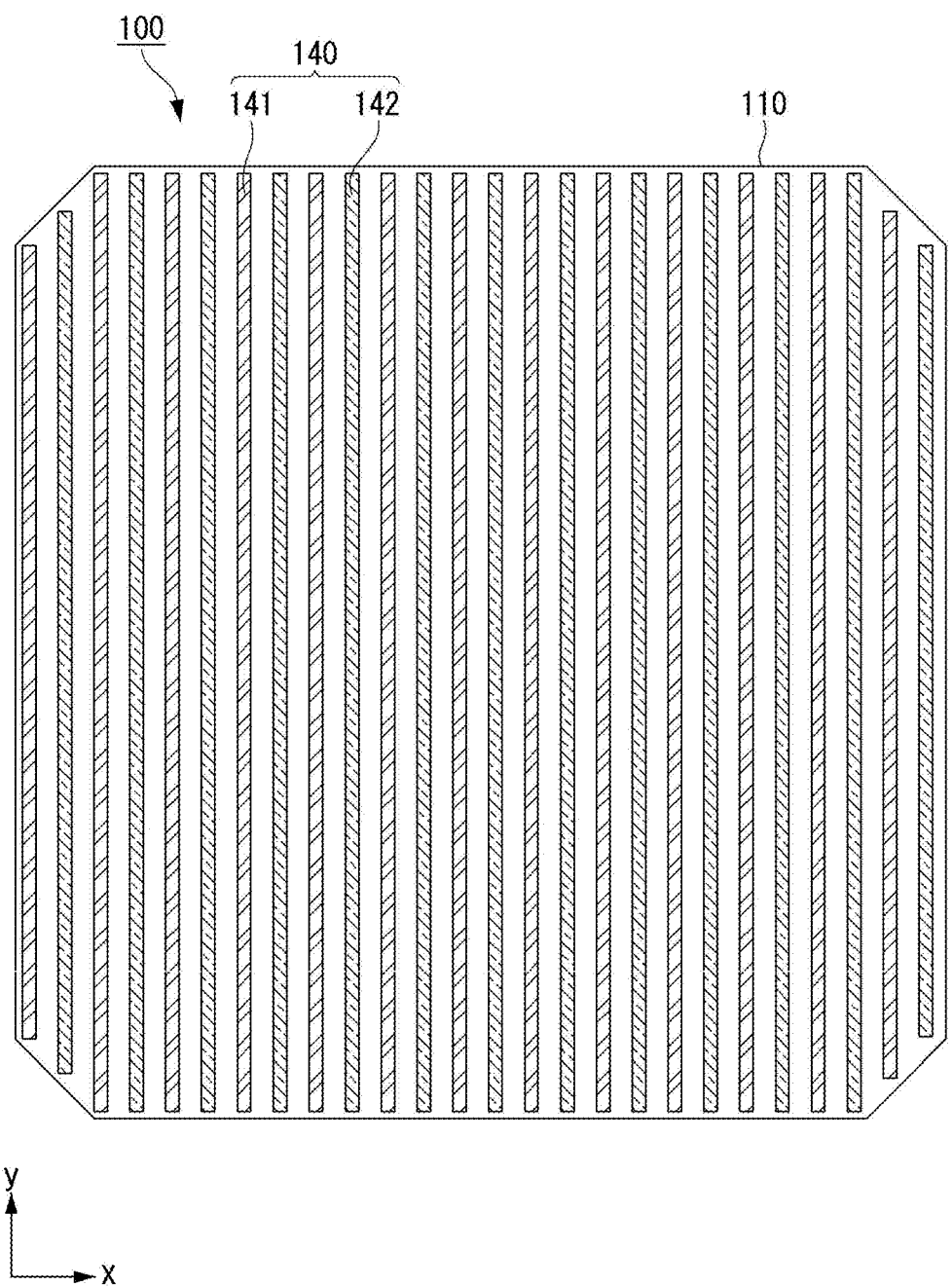

FIGS. 6 to 8 illustrate an example of a solar cell applied to an embodiment of the invention. More specifically, FIG. 6 is a partial perspective view illustrating an example of a solar cell applied to an embodiment of the invention. FIG. 7 is a cross-sectional view of a solar cell in a first direction. FIG. 8 illustrates a pattern of first and second electrodes formed on a back surface of a semiconductor substrate.

As shown in FIGS. 6 and 7, an example of a solar cell according to the embodiment of the invention may include an anti-reflection layer 130, a semiconductor substrate 110, a tunnel layer 180, a plurality of first semiconductor regions 121, a plurality of second semiconductor regions 172, a plurality of intrinsic semiconductor regions 150, a passivation layer 190, a plurality of first electrodes 141, and a plurality of second electrodes 142.

In the embodiment disclosed herein, the anti-reflection layer 130, the tunnel layer 180, and the passivation layer 190 may be omitted, if desired or necessary. However, when the solar cell includes them, efficiency of the solar cell may be further improved. Thus, the embodiment of the invention is described using the solar cell including the anti-reflection layer 130, the tunnel layer 180, and the passivation layer 190 by way of example.

The semiconductor substrate 110 may be formed of at least one of single crystal silicon and polycrystalline silicon containing impurities of a first conductive type or a second conductive type. For example, the semiconductor substrate 110 may be formed of a single crystal silicon wafer.

In the embodiment disclosed herein, the first conductive type or the second conductive type of the semiconductor substrate 110 may be one of an n-type and a p-type.

When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, the embodiment of the invention is described using an example where impurities contained in the semiconductor substrate 110 are impurities of the second conductive type and are n-type impurities. However, the embodiment of the invention is not limited thereto.

A front surface of the semiconductor substrate 110 may be an uneven surface having a plurality of uneven portions or having uneven characteristics. Thus, the first semiconductor regions 121 positioned on the front surface of the semiconductor substrate 110 may have an uneven surface.

Hence, an amount of light reflected from the front surface of the semiconductor substrate 110 may decrease, and an amount of light incident on the inside of the semiconductor substrate 110 may increase.

The anti-reflection layer 130 may be positioned on the front surface of the semiconductor substrate 110, so as to minimize a reflection of light incident on the front surface of the semiconductor substrate 110 from the outside. The anti-reflection layer 130 may be formed of at least one of aluminum oxide (AlOx), silicon nitride (SiNx), silicon oxide (SiOx), and silicon oxynitride (SiOxNy).

The tunnel layer 180 may be disposed on an entire back surface of the semiconductor substrate 110 while directly contacting the entire back surface of the semiconductor substrate 110 and may include a dielectric material. Thus, as shown in FIGS. 6 and 7, the tunnel layer 180 may pass through carriers produced in the semiconductor substrate 110.

In other words, the tunnel layer 180 may pass through carriers produced in the semiconductor substrate 110 and may perform a passivation function with respect to the back surface of the semiconductor substrate 110.

The tunnel layer 180 may be formed of a dielectric material including silicon carbide (SiCx) or silicon oxide (SiOx) having strong durability at a high temperature equal to or higher than 600° C. Other materials may be used.

As shown in FIGS. 6 and 7, the first semiconductor region 121 may be disposed on the back surface of the semiconductor substrate 110. For example, the first semiconductor region 121 may be disposed on a back surface of the tunnel layer 180 while directly contacting a portion of the back surface of the tunnel layer 180.

The first semiconductor regions 121 may extend in the second direction y at the back surface of the semiconductor substrate 110. The first semiconductor regions 121 may be formed of polycrystalline silicon material of the first conductive type opposite the second conductive type.

The first semiconductor regions 121 may be doped with impurities of the first conductive type. When impurities contained in the semiconductor substrate 110 is impurities of the second conductive type, the first semiconductor regions 121 may form a p-n junction together with the semiconductor substrate 110 with the tunnel layer 180 interposed therebetween.

Because each first semiconductor region 121 forms the p-n junction together with the semiconductor substrate 110, the first semiconductor region 121 may be of the p-type. When the first semiconductor region 121 is of the p-type, the first semiconductor region 121 may be doped with impurities of a group III element such as B, Ga, and In.

The plurality of second semiconductor regions 172 may be disposed at the back surface of the semiconductor substrate 110 and may extend in the second direction y parallel to the first semiconductor regions 121. For example, each second semiconductor region 172 may directly contact a portion (spaced apart from each first semiconductor region 121) of the back surface of the tunnel layer 180.

The second semiconductor regions 172 may be formed of polycrystalline silicon material more heavily doped than the semiconductor substrate 110 with impurities of the second conductive type. Thus, for example, when the semiconductor substrate 110 is doped with impurities of the second conductive type, i.e., n-type impurities, each second semiconductor region 172 may be an $n^+$-type region.

A potential barrier is formed by a difference in an impurity concentration between the semiconductor substrate 110 and the second semiconductor regions 172. Hence, the second semiconductor regions 172 can prevent or reduce holes from moving to the second semiconductor regions 172 used as a moving path of electrons through the potential barrier and can make it easier for carriers (for example, electrons) to move to the second semiconductor regions 172.

Thus, the embodiment of the invention can reduce an amount of carriers lost by a recombination and/or a disappearance of electrons and holes at and around the second semiconductor regions 172 or at and around the first and second electrodes 141 and 142 and can accelerates a movement of electrons, thereby increasing an amount of electrons moving to the second semiconductor regions 172.

So far, FIGS. 6 and 7 illustrate that the semiconductor substrate 110 is doped with impurities of the second conductive type, the first semiconductor regions 121 serve as an emitter region, and the second semiconductor regions 172 serve as a back surface field region, by way of example.

However, when the semiconductor substrate 110 is doped with impurities of the first conductive type unlike FIGS. 6 and 7, the first semiconductor regions 121 may serve as a back surface field region, and the second semiconductor regions 172 may serve as an emitter region.

Further, FIGS. 6 and 7 illustrate that the first semiconductor regions 121 and the second semiconductor regions 172 are formed on the back surface of the tunnel layer 180 using polycrystalline silicon material, by way of example.

However, if the tunnel layer 180 is omitted unlike FIGS. 6 and 7, the first semiconductor regions 121 and the second semiconductor regions 172 may be doped by diffusing impurities into the back surface of the semiconductor substrate 110. In this instance, the first semiconductor regions 121 and the second semiconductor regions 172 may be formed of the same material (for example, single crystal silicon) as the semiconductor substrate 110.

As shown in FIGS. 6 and 7, the intrinsic semiconductor layer 150 may be formed on the back surface of the tunnel layer 180 exposed between the first semiconductor region 121 and the second semiconductor region 172. The intrinsic semiconductor layer 150 may be formed as an intrinsic polycrystalline silicon layer, that is not doped with impurities of the first conductive type or impurities of the second conductive type, unlike the first semiconductor region 121 and the second semiconductor region 172.

Further, as shown in FIGS. 6 and 7, the intrinsic semiconductor layer 150 may be configured such that both sides directly contact the side of the first semiconductor region 121 and the side of the second semiconductor region 172, respectively.

The passivation layer 190 removes a defect resulting from a dangling bond formed in a back surface of a polycrystalline silicon layer formed at the first semiconductor regions 121, the second semiconductor regions 172, and the intrinsic semiconductor layers 150, and thus can prevent carriers produced in the semiconductor substrate 110 from being recombined and disappeared by the dangling bond.

As shown in FIG. 8, the plurality of first electrodes 141 may be connected to the first semiconductor regions 121 and may extend in the second direction y. The first electrodes 141 may collect carriers (for example, holes) moving to the first semiconductor regions 121.

The plurality of second electrodes 142 may be connected to the second semiconductor regions 172 and may extend in the second direction y in parallel with the first electrodes 141. The second electrodes 142 may collect carriers (for example, electrons) moving to the second semiconductor regions 172.

As shown in FIG. 8, the first and second electrodes 141 and 142 may extend in the second direction y and may be spaced apart from each other in the first direction x. Further, the first and second electrodes 141 and 142 may be alternately disposed in the first direction x.

In the solar cell having the above-described structure according to the embodiment of the invention, holes collected by the first electrodes 141 and electrons collected by the second electrodes 142 may be used as electric power of an external device through an external circuit device.

The solar cell applied to the solar cell module according to the embodiment of the invention is not limited to FIGS. 6 and 7. The components of the solar cell may be variously changed, except that the first and second electrodes 141 and 142 included in the solar cell are formed on the back surface of the semiconductor substrate 110.

For example, the solar cell module according to the embodiment of the invention may use a metal wrap through (MWT) solar cell, that is configured such that a portion of the first electrode 141 and the first semiconductor region 121 are positioned on the front surface of the semiconductor substrate 110, and the portion of the first electrode 141 is connected to a remaining portion of the first electrode 141 formed on the back surface of the semiconductor substrate 110 through a hole of the semiconductor substrate 110.

In order to minimize a plastic strain of the first and second conductive lines in the solar cell module according to the embodiment of the invention, a first edge among both edges (extending in the second direction) of each of at least some of the plurality of first conductive adhesive layers 251 may be positioned inside an overlap area between the first and second conductive lines and the first conductive adhesive layers 251, and a remaining second edge may be positioned outside the overlap area.

This is described in detail below. The description duplicative with that illustrated in FIGS. 1 to 8 is omitted, and additional description is mainly described.

Figure 9:
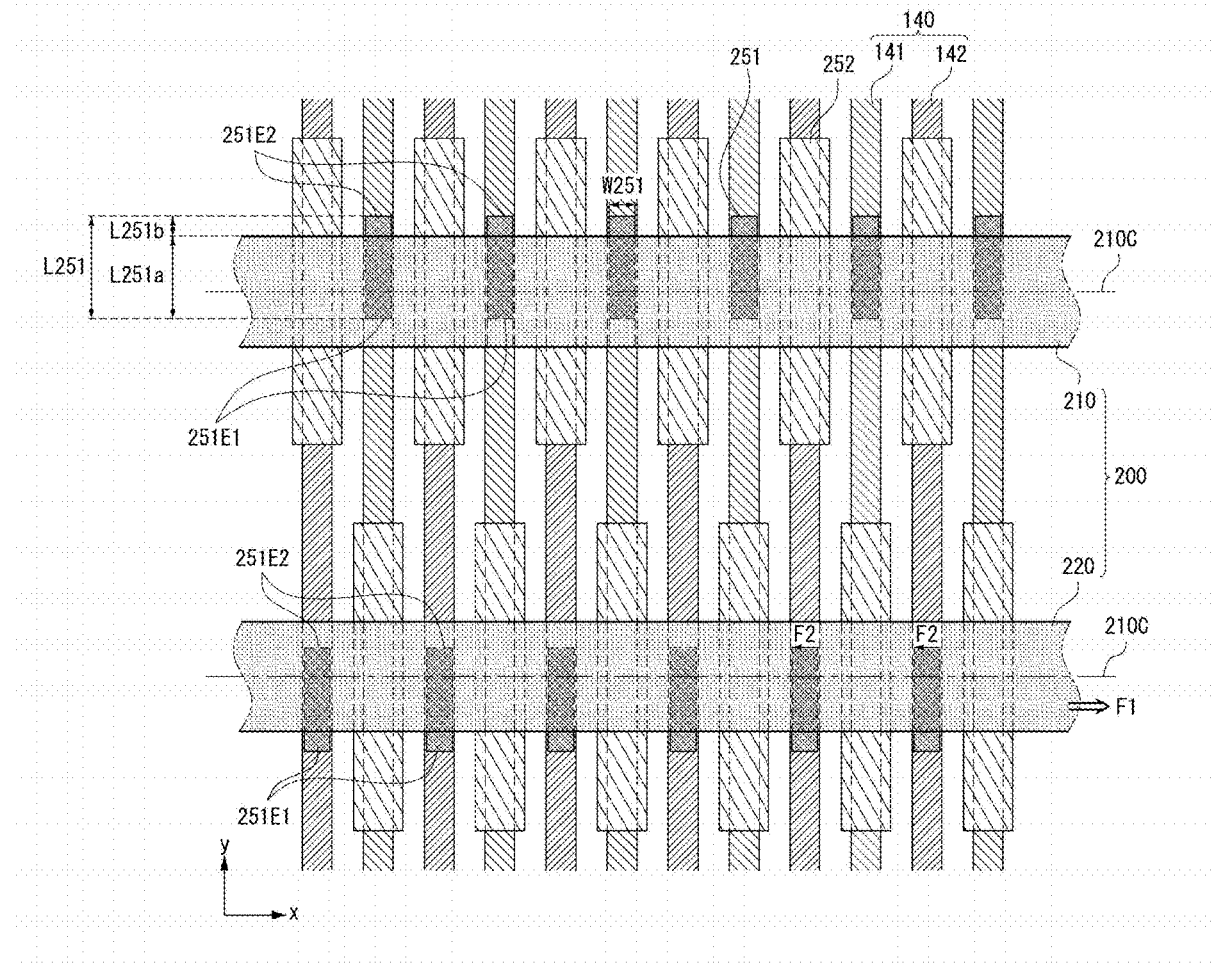
FIG. 9 illustrates a first example of a pattern of a first conductive adhesive layer in a solar cell module according to an embodiment of the invention.

FIG. 9 illustrates a first example of a pattern of a first conductive adhesive layer in the solar cell module according to the embodiment of the invention.

As shown in FIG. 9, each of a plurality of first conductive adhesive layers 251 may include a first edge 251E1 and a second edge 251E2 respectively positioned at both ends in the second direction y.

More specifically, as shown in FIG. 9, the first conductive adhesive layer 251 may extend in the second direction y corresponding to a longitudinal direction of the first and second electrodes 141 and 142. Thus, both edges of the first conductive adhesive layer 251 in the second direction y indicate both edges of the first conductive adhesive layer 251 in its longitudinal direction.

In this instance, at least some first conductive adhesive layer 251 positioned at a crossing between the first electrode 141 and the first conductive line 210 and a crossing between the second electrode 142 and the second conductive line 220 may be one first conductive adhesive layer 251.

Namely, as shown in FIG. 9, the number of at least some first conductive adhesive layer 251 positioned at a crossing between any one first electrode 141 and any one first conductive line 210 and a crossing between any one second electrode 142 and any one second conductive line 220 may be one.

As shown in FIG. 9, in each of at least some of the plurality of first conductive adhesive layers 251, a first edge 251E1 may be positioned inside an overlap area where the first and second conductive lines 210 and 220 are overlapping, and a second edge 251E2 may be positioned outside the overlap area.

In the embodiment disclosed herein, "at least some" means all of the plurality of first conductive adhesive layers 251 or some of the plurality of first conductive adhesive layers 251.

Figure 10:
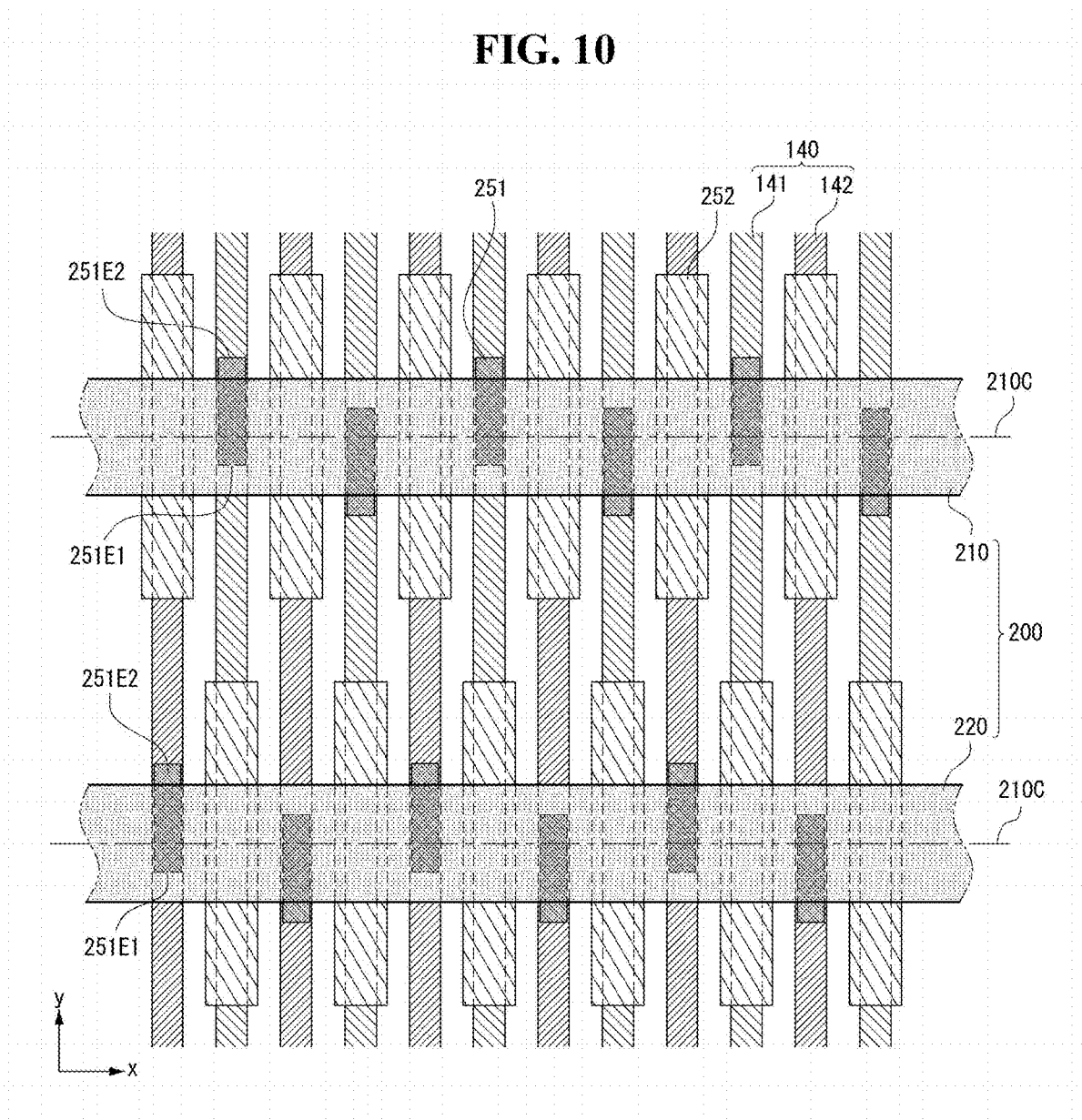
FIG. 10 illustrates a modified example of a first example of a pattern of a first conductive adhesive layer in a solar cell module according to an embodiment of the invention.
Figure 11:
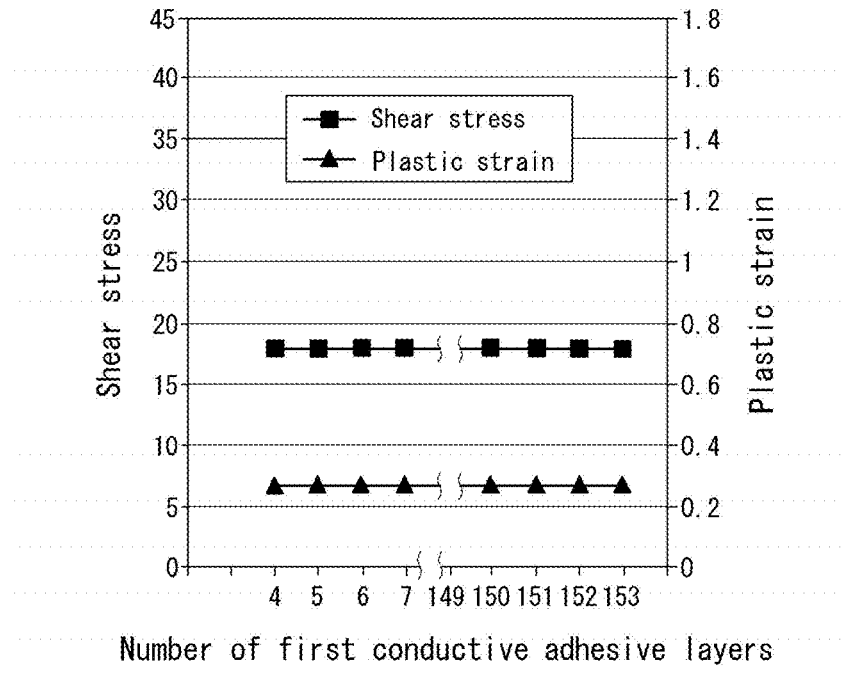
FIG. 11 illustrates an effect of a pattern of a first conductive adhesive layer according to an embodiment of the invention.
Figure 11:
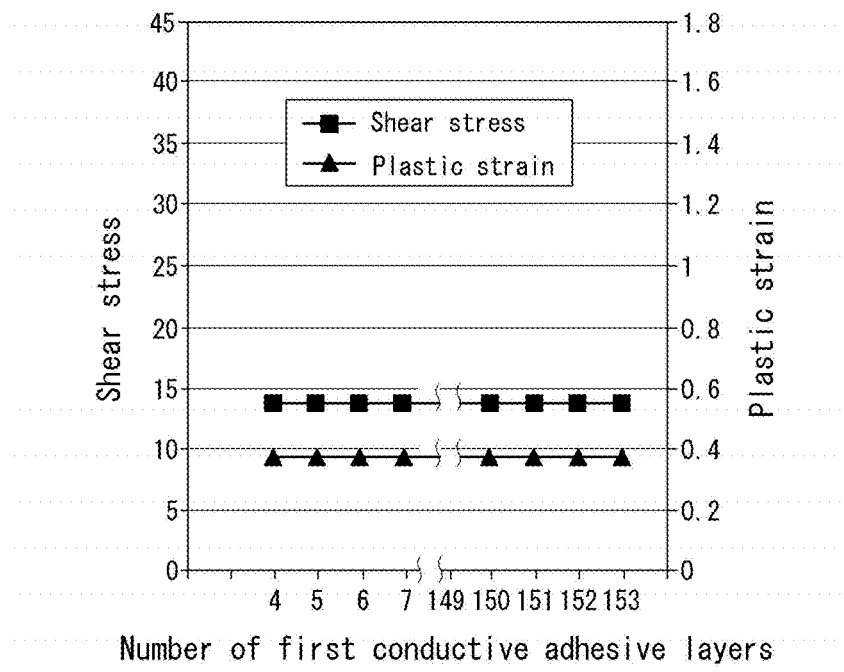

FIGS. 9 to 11 illustrate an example where each first edge 251E1 of all of the plurality of first conductive adhesive layers 251 is positioned inside an overlap area between the first and second conductive lines 210 and 220 and the first conductive adhesive layers 251, and each second edge 251E2 of the first conductive adhesive layers 251 is positioned outside the overlap area between the first and second conductive lines 210 and 220 and the first conductive adhesive layers 251.

When the first edge 251E1 of the first conductive adhesive layer 251 is positioned inside an overlap area between the first and second conductive lines 210 and 220 and the first conductive adhesive layer 251, and the second edge 251E2 of the first conductive adhesive layer 251 is positioned outside the overlap area as described above, a plastic strain of the first and second conductive lines 210 and 220 can be reduced.

Namely, even if a shear stress F1 is applied to the first and second conductive lines 210 and 220 in the first direction x because a temperature inside the solar cell module repeats a high temperature and a low temperature due to an influence of the seasons, the weather, etc., a shear stress resistance force F2, that acts on in the opposite direction of the shear stress F1, may be greatly generated at the first edge 251E1 of the first conductive adhesive layer 251 when the first edge 251E1 of the first conductive adhesive layer 251 is positioned inside an overlap area between the first and second conductive lines 210 and 220 and the first conductive adhesive layer 251, and the second edge 251E2 of the first conductive adhesive layer 251 is positioned outside the overlap area. Hence, the plastic strain of the first and second conductive lines 210 and 220 can be reduced.

In order words, the first conductive adhesive layer 251 can reduce the plastic strain of the first and second conductive lines 210 and 220 when the first edge 251E1 of the first conductive adhesive layer 251 is positioned inside the overlap area.

In this instance, because a side of the first edge 251E1 of the first conductive adhesive layer 251 is extended in the first direction x, the shear stress resistance force F2 may further increase. Hence, the plastic strain of the first and second conductive lines 210 and 220 can be further reduced.

A length L251 (hereinafter, referred to as "second direction length") of each first conductive adhesive layer 251 in the second direction y may be less than a linewidth of each of the first and second conductive lines 210 and 220. A first direction width W251 of the first conductive adhesive layer 251 may be less than the second direction length L251 of the first conductive adhesive layer 251.

For example, the second direction length L251 of the first conductive adhesive layer 251 may be 850 μm to 1,150 μm, and the first direction width W251 of the first conductive adhesive layer 251 may be 250 μm to 350 μm.

In order to secure a physical adhesive strength between the first and second electrodes 141 and 142 and the first and second conductive lines 210 and 220 at a desired level, a length L251a of the first conductive adhesive layer 251 overlapping the first and second conductive lines 210 and 220 may be 60% to 90% of the second direction length L251 of the first conductive adhesive layer 251.

For example, when the second direction length L251 of the first conductive adhesive layer 251 is 1,000 μm, the length L251a of the first conductive adhesive layer 251 in the second direction y overlapping the first and second conductive lines 210 and 220 may be about 850 μm, and a length L251b of the first conductive adhesive layer 251 protruding in the second direction y may be about 150 μm.

Hence, the physical adhesive strength between the first and second electrodes 141 and 142 and the first and second conductive lines 210 and 220 can be secured at a desired level through the first conductive adhesive layer 251. Further, the reversing force of the first conductive adhesive layer 251 can be secured at a desired level.

The first conductive adhesive layer 251 may be positioned asymmetrically with respect to central lines 210C and 220C of the first and second conductive lines 210 and 220 along the longitudinal direction of the first and second conductive lines 210 and 220.

More specifically, as shown in FIG. 9, a center of each first conductive adhesive layer 251 may be positioned on one side of an overlap area between the first and second conductive lines 210 and 220 and the first conductive adhesive layers 251 based on the central lines 210C and 220C of the first and second conductive lines 210 and 220.

The first edge 251E1 of the first conductive adhesive layer 251 may be positioned on the other side of the overlap area based on the central lines 210C and 220C, and the second edge 251E2 of the first conductive adhesive layer 251 may protrude to the outside of the one side of the overlap area.

FIG. 9 illustrates that the center of each first conductive adhesive layer 251 is one-sided based on the central lines 210C and 220C of the first and second conductive lines 210 and 220, as an example. However, the embodiment of the invention is not limited thereto.

For example, a center of a portion of the first conductive adhesive layer 251 may be positioned on one side of the first and second conductive lines 210 and 220, and a center of a remaining portion of the first conductive adhesive layer 251 may be positioned on the other side of the first and second conductive lines 210 and 220.

This is described in detail below.

FIG. 10 illustrates a modified example of the first example of the pattern of the first conductive adhesive layer in the solar cell module according to the embodiment of the invention.

As shown in FIG. 10, the first conductive adhesive layers 251 may be arranged in a zigzag shape based on the central lines 210C and 220C of the first and second conductive lines 210 and 220 along the longitudinal direction of the first and second conductive lines 210 and 220.

Namely, in each of the first and second conductive lines 210 and 220, centers of the first conductive adhesive layers 251 may be alternately positioned on one side and the other side of an overlap area between the first and second conductive lines 210 and 220 and the first conductive adhesive layers 251 based on the central lines 210C and 220C of the first and second conductive lines 210 and 220 along the longitudinal direction (i.e., the first direction x) of the first and second conductive lines 210 and 220.

Hence, the first edges 251E1 of the first conductive adhesive layers 251 may be alternately positioned on one side and the other side of an overlap area between the first and second conductive lines 210 and 220 and the first conductive adhesive layers 251 based on the central lines 210C and 220C of the first and second conductive lines 210 and 220, and the second edge 251E2 of the first conductive adhesive layer 251 may alternately protrude to the outside of the other side and one side of the overlap area.

When the first edges 251E1 of the first conductive adhesive layers 251 are positioned inside an overlap area between the first and second conductive lines 210 and 220 and the first conductive adhesive layers 251, and the second edges 251E2 of the first conductive adhesive layers 251 are positioned outside the overlap area as described above, the shear stress resistance force of the first conductive adhesive layers 251 can be further improved.

FIG. 11 illustrates an effect of the pattern of the first conductive adhesive layer according to the embodiment of the invention.

More specifically, (a) of FIG. 11 is a graph of a comparative example illustrating a shear stress and a plastic strain of the first and second conductive lines 210 and 220 when both edges of the first conductive adhesive layers 251 in the second direction y are positioned outside an overlap area between the first and second conductive lines 210 and 220 and the first conductive adhesive layers 251.

Further, (b) of FIG. 11 is a graph according to the embodiment of the invention illustrating a shear stress and a plastic strain of the first and second conductive lines 210 and 220 when the first edge 251E1 among both edges of the first conductive adhesive layer 251 in the second direction y is positioned inside an overlap area between the first and second conductive lines 210 and 220 and the first conductive adhesive layer 251, and the second edge 251E2 of the first conductive adhesive layer 251 is positioned outside the overlap area.

As shown in (a) of FIG. 11, in the comparative example, the plastic strain of the first and second conductive lines 210 and 220 was about 0.7% to 0.8%. On the other hand, as shown in (b) of FIG. 11, in the embodiment of the invention, the plastic strain of the first and second conductive lines 210 and 220 was equal to or less than about 0.6%. Namely, it can be seen from FIG. 11 that the pattern of the first conductive adhesive layer 251 according to the embodiment of the invention generates a strong stress.

So far, the embodiment of the invention described that the first conductive adhesive layers 251 are positioned asymmetrically based on the central lines 210C and 220C of the first and second conductive lines 210 and 220, by way of example.

However, the embodiment of the invention may be equally applied to when the first conductive adhesive layers 251 are positioned symmetrically based on the central lines 210C and 220C of the first and second conductive lines 210 and 220. In this instance, the embodiment of the invention may anticipate a more improved effect.

Hereinafter, an example where the first conductive adhesive layers 251 are positioned symmetrically based on the central lines 210C and 220C of the first and second conductive lines 210 and 220 is described.

Figure 12:
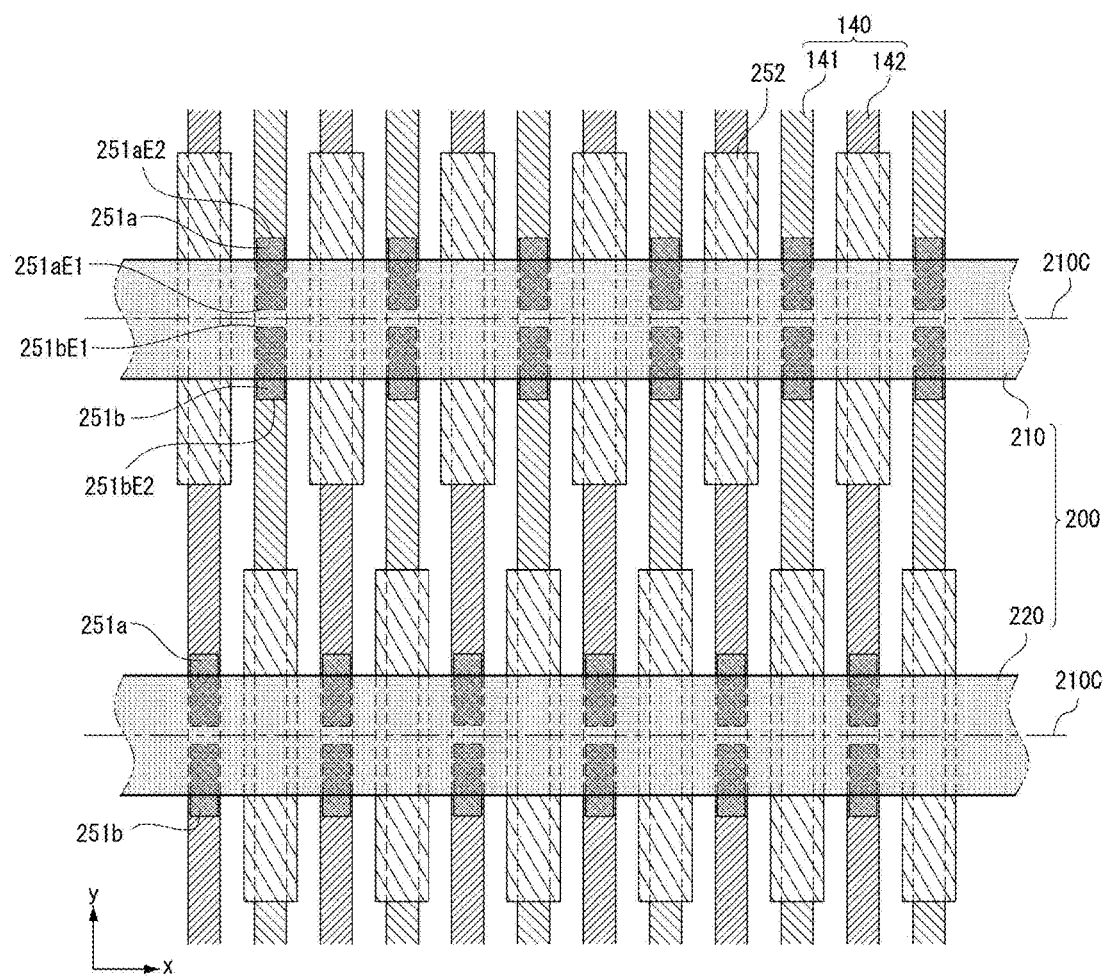
FIG. 12 illustrates a second example of a pattern of a first conductive adhesive layer in a solar cell module according to an embodiment of the invention.

FIG. 12 illustrates a second example of a pattern of a first conductive adhesive layer in the solar cell module according to the embodiment of the invention.

As shown in FIG. 12, each first conductive adhesive layer 251 may include a plurality of parts 251a and 251b at each of a crossing between the first electrode 141 and the first conductive line 210 and a crossing between the second electrode 142 and the second conductive line 220.

The plurality of first conductive adhesive layers 251a and 251b, that are spaced apart from each other in the second direction y, may be positioned symmetrically based on central lines 210C and 220C of the first and second conductive lines 210 and 220.

The plurality of first conductive adhesive layers 251a and 251b of each first conductive adhesive layer 251 may be spaced apart from each other in the second direction y inside an overlap area between the first and second conductive lines 210 and 220 and the first conductive adhesive layer 251.

In this instance, a first edge 251E1 of each of the first conductive adhesive layers 251a and 251b, that are spaced apart from each other in the second direction y at each of the crossing between the first electrode 141 and the first conductive line 210 and the crossing between the second electrode 142 and the second conductive line 220, may be positioned inside the overlap area between the first and second conductive lines 210 and 220 and the first conductive adhesive layer 251, and a second edge 251E2 of each of the first conductive adhesive layers 251a and 251b may be positioned outside the overlap area.

Hence, the second example of the pattern of the first conductive adhesive layer 251 can further improve a shear stress resistance force of the first conductive adhesive layer 251 because the two edges of the first conductive adhesive layer 251 are positioned inside the overlap area.

Figure 13:
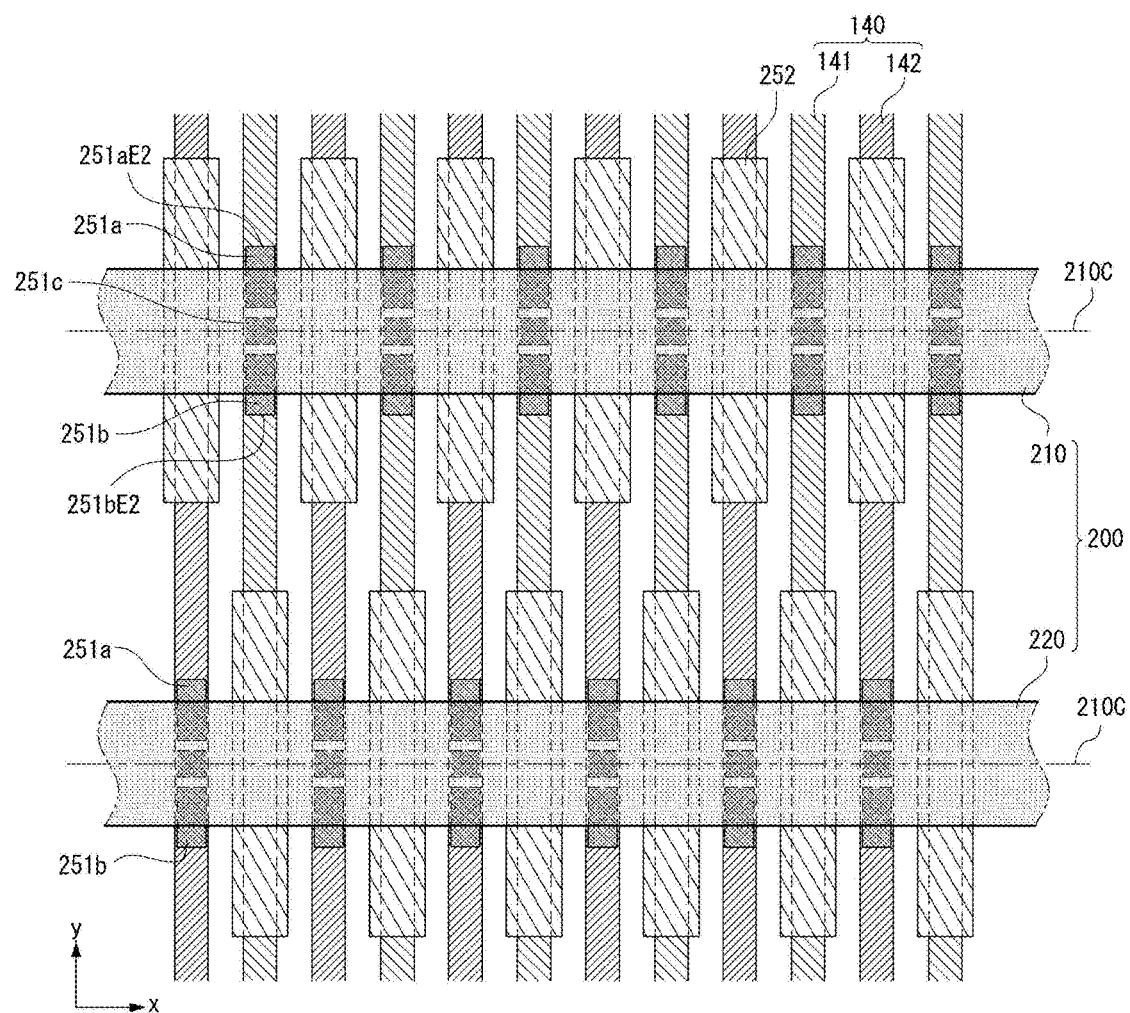
FIG. 13 illustrates a third example of a pattern of a first conductive adhesive layer in a solar cell module according to an embodiment of the invention.

FIG. 13 illustrates a third example of a pattern of a first conductive adhesive layer in the solar cell module according to the embodiment of the invention.

As shown in FIG. 13, a third example of a pattern of a first conductive adhesive layer 251 may divide each first conductive adhesive layer 251 at a crossing between the first electrode 141 and the first conductive line 210 and a crossing between the second electrode 142 and the second conductive line 220 to form in a plurality of first conductive adhesive layers 251a and 251b. The third example may further include a separate first conductive adhesive layer 251c between the first conductive adhesive layers 251a and 251b, that are spaced apart from each other in the second direction y. Both edges of the first conductive adhesive layer 251c may be positioned inside an overlap area between the first and second conductive lines 210 and 220 and the first conductive adhesive layer 251.

The first conductive adhesive layer 251c may be spaced apart from each of the first conductive adhesive layers 251a and 251b, that are spaced apart from each other in the second direction y.

Namely, as shown in FIG. 13, the plurality of first conductive adhesive layers 251a, 251b, and 251c formed at the crossing between the first electrode 141 and the first conductive line 210 and the crossing between the second electrode 142 and the second conductive line 220 may be spaced apart from one another inside the overlap area.

Hence, the third example of the pattern of the first conductive adhesive layer 251 can further improve a shear stress resistance force of the first conductive adhesive layer 251 because the four edges of the first conductive adhesive layer 251 are positioned inside the overlap area.

So far, the embodiment of the invention described that the first edges 251E1 of the plurality of first conductive adhesive layers 251 are positioned inside the overlap area, and the second edges 251E2 of the plurality of first conductive adhesive layers 251 are positioned outside the overlap area, by way of example.

However, only in some of the plurality of first conductive adhesive layers 251, one edge may be positioned inside the overlap area. This is described below.

Figure 14:
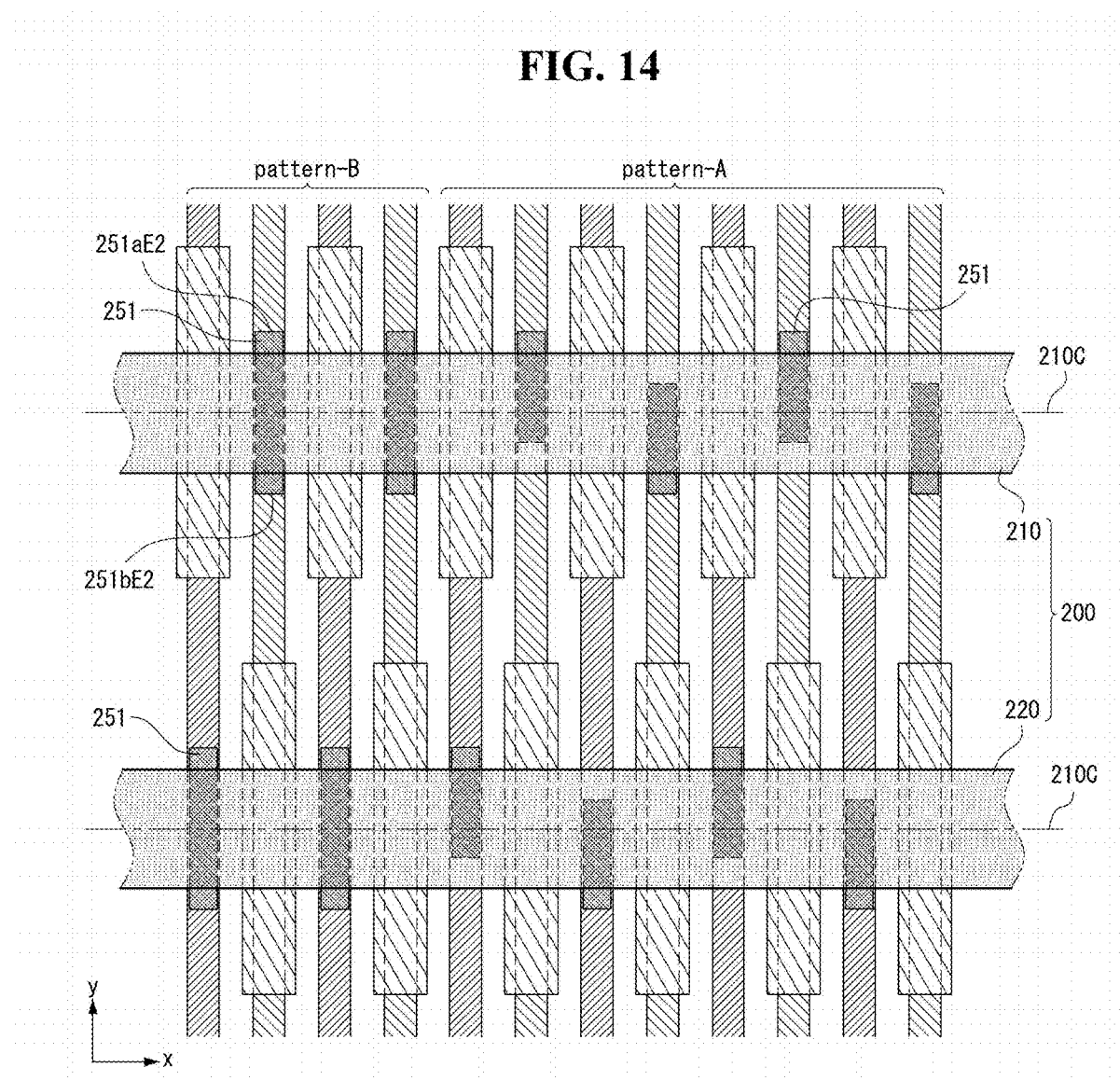
FIG. 14 illustrates a fourth example of a pattern of a first conductive adhesive layer in a solar cell module according to an embodiment of the invention.

FIG. 14 illustrates a fourth example of a pattern of a first conductive adhesive layer in the solar cell module according to the embodiment of the invention.

As shown in FIG. 14, a pattern of a plurality of first conductive adhesive layers 251 according to the embodiment of the invention may include a first pattern pattern-A and a second pattern pattern-B.

Namely, the plurality of first conductive adhesive layers 251 may be positioned at a crossing between the first electrode 141 and the first conductive line 210 and a crossing between the second electrode 142 and the second conductive line 220. Some of the plurality of first conductive adhesive layers 251 may be formed in the first pattern pattern-A, and remaining first conductive adhesive layers 251 may be formed in the second pattern pattern-B.

A first edge 251E1 of the first conductive adhesive layer 251 formed in the first pattern pattern-A may be positioned inside an overlap area between the first and second conductive lines 210 and 220 and the first conductive adhesive layer 251, and a second edge 251E2 of the first conductive adhesive layer 251 formed in the second pattern pattern-B may be positioned outside the overlap area.

FIG. 14 illustrates that the first conductive adhesive layer 251 formed in the first pattern pattern-A is formed in the same pattern as FIG. 10, by way of example. However this is merely an example. The patterns of the first conductive adhesive layer 251 shown in FIGS. 9, 12, and 13 may be applied to FIG. 14.

As shown in FIG. 14, both edges of the first conductive adhesive layer 251 formed in the second pattern pattern-B in the second direction y may be positioned outside the overlap area between the first and second conductive lines 210 and 220 and the first conductive adhesive layer 251.

Thus, a second direction length L251 of the first conductive adhesive layer 251 formed in the first pattern pattern-A may be less than a linewidth of each of the first and second conductive lines 210 and 220. On the other hand, a second direction length L251 of the first conductive adhesive layer 251 formed in the second pattern pattern-B may be greater than the linewidth of each of the first and second conductive lines 210 and 220.

Hence, the solar cell module according to the embodiment of the invention causes the first conductive adhesive layer 251 to include both the first pattern pattern-A and the second pattern pattern-B, thereby securing a shear stress resistance force and a physical adhesive strength of the first conductive adhesive layer 251 at a desired level.

The first conductive adhesive layer 251 may be variously changed in the first pattern pattern-A and the second pattern pattern-B. This is described in detail below.

Figure 15:
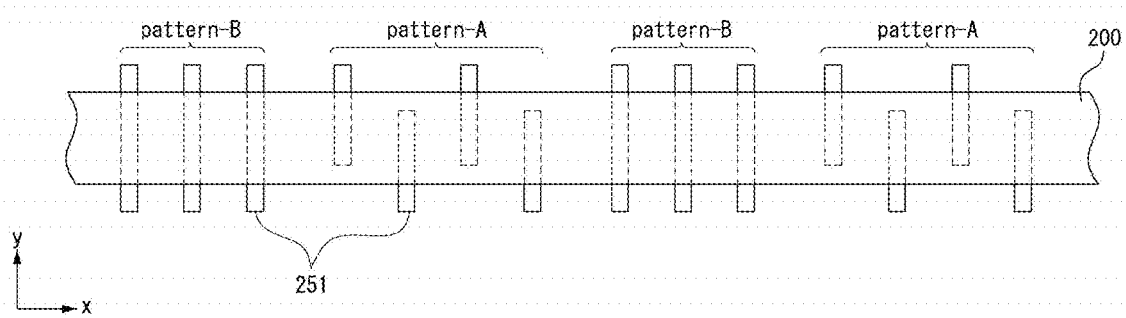
FIGS. 15 and 16 illustrate various modified examples of a fourth example of a pattern of a first conductive adhesive layer in a solar cell module according to an embodiment of the invention.
Figure 16:
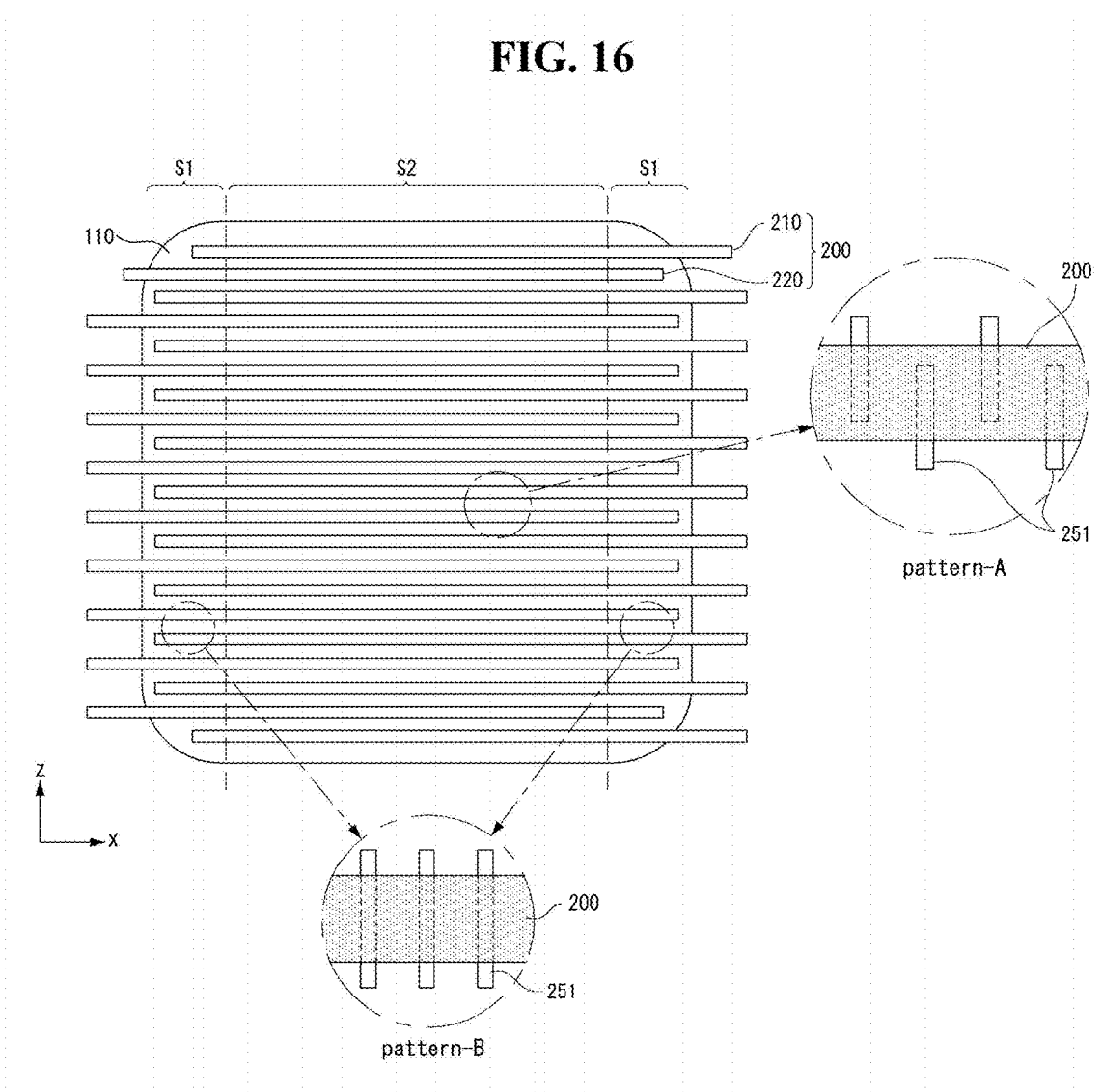

FIGS. 15 and 16 illustrate various modified examples of a fourth example of a pattern of a first conductive adhesive layer in the solar cell module according to the embodiment of the invention.

As shown in FIG. 15, a first conductive adhesive layer 251 formed in a first pattern pattern-A and a first conductive adhesive layer 251 formed in a second pattern pattern-B may be alternately positioned along the longitudinal direction of the first and second conductive lines 210 and 220.

Alternatively, as shown in FIG. 16, a first conductive adhesive layer 251 formed in a first pattern pattern-A may be positioned in a middle portion S2 of the semiconductor substrate, and a first conductive adhesive layer 251 formed in a second pattern pattern-B may be positioned in an edge portion S1 of the semiconductor substrate.

As shown in FIG. 16, as the first conductive adhesive layer 251 is formed in the second pattern pattern-B in the edge portion S1 of the semiconductor substrate, in which a relatively strong shear stress is applied to the first and second conductive lines 210 and 220, a physical adhesive strength between the conductive line 200 and the electrode 140 can be further improved.

Further, as the first conductive adhesive layer 251 is formed in the first pattern pattern-A in the middle portion S2 of the semiconductor substrate, in which a relatively weak shear stress is applied to the first and second conductive lines 210 and 220, a plastic strain of the conductive line 200 can be further reduced.

Hence, reliability of the solar cell module according to the embodiment of the invention may be further improved.

Hereinafter, an example where the conductive line 200 is formed in an asymmetric shape in the solar cell module according to the embodiment of the invention is described.

Figure 17:
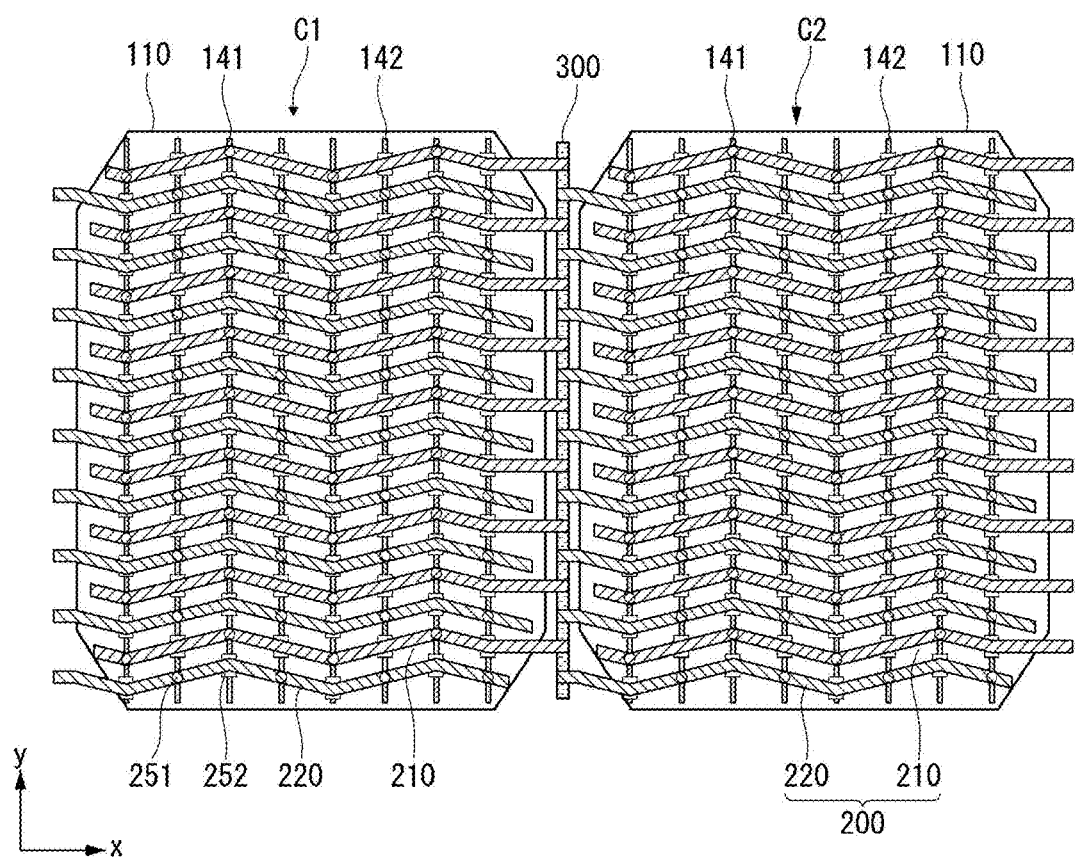
FIGS. 17 to 19 illustrate a first example of an asymmetric shape of a conductive line in a solar cell module according to an embodiment of the invention.
Figure 18:
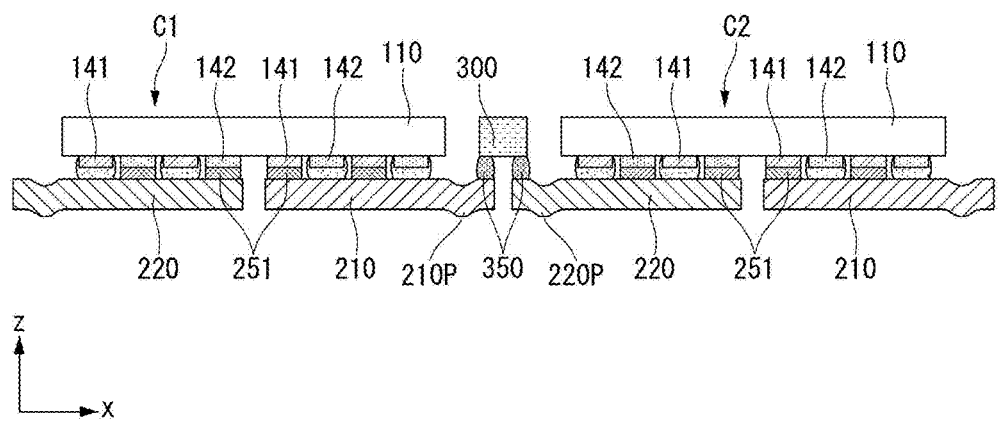
Figure 19:
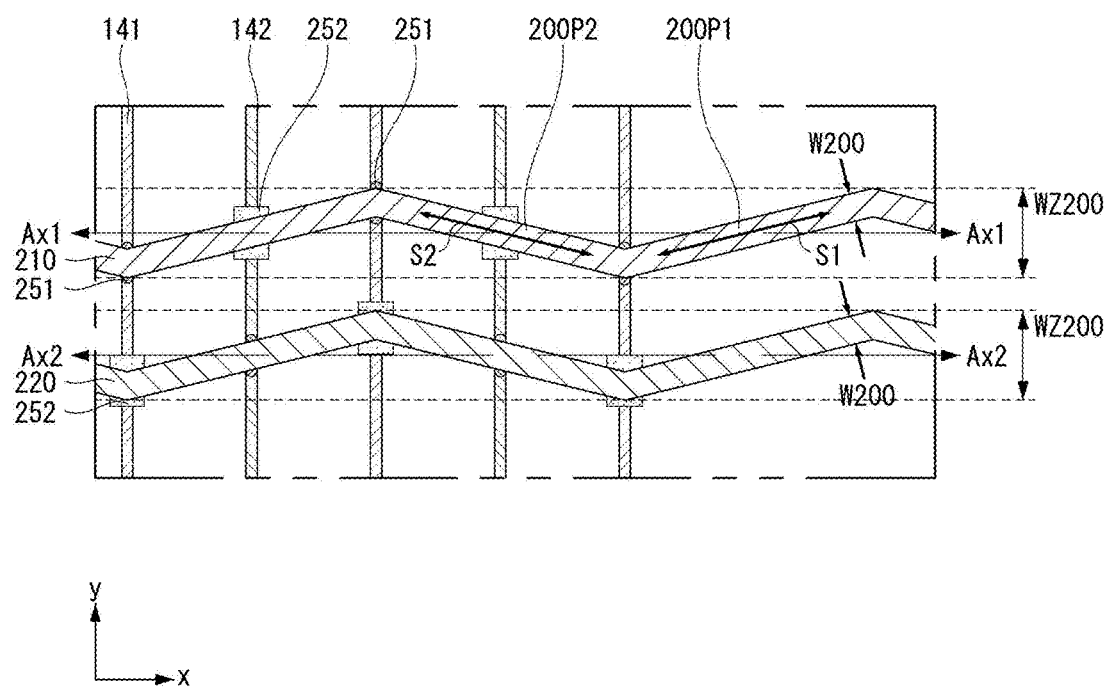

FIGS. 17 to 19 illustrate a first example of an asymmetric shape of a conductive line in the solar cell module according to the embodiment of the invention.

More specifically, FIG. 17 illustrates a first example of an asymmetric shape of a conductive line when viewed from the back surface of the solar cell module, and FIG. 18 is a cross-sectional view of FIG. 17.

FIG. 19 is an enlarged view of the conductive line 200 shown in FIG. 17.

As shown in FIG. 17, each of the first and second conductive lines 200 may have an asymmetric shape with respect to both sides of a first direction central axis of each of the first and second conductive lines 200 in the first direction x. This is described in detail below with reference to FIG. 19.

As shown in FIG. 18, an end of each of the first and second conductive lines 200 protruding to the outside of a projection area of the semiconductor substrate 110 may include a portion 200P bending in a third direction z crossing the first and second directions x and y.

When the first and second conductive lines 200 are thermally processed and are connected to the intercell connector 300, a shear stress of the first and second conductive lines 200 generated during a thermal process can be reduced because the end of each of the first and second conductive lines 200 includes the bending portion 200P as described above.

When the first and second conductive lines 200 are thermally processed and are connected to the intercell connector 300, the first and second conductive lines 200 may be thermally expanded in the first direction x during the thermal process. Hence, the shear stress of the first and second conductive lines 200 may be transferred to the first conductive adhesive layer 251 connecting the first and second conductive lines 200 to the first and second electrodes 141 and 142.

As a result, a physical adhesive strength of the first conductive adhesive layer 251 may be reduced, and the first conductive line 210 and the first electrode 141 or the second conductive line 220 and the second electrode 142 may be disconnected from each other.

However, when the end of each of the first and second conductive lines 200 includes the bending portion 200P, the first and second conductive lines 200 may be thermally expanded in the third direction z. Hence, the shear stress of the first and second conductive lines 200 in the first direction x can be reduced.

As a result, the bending portion 200P may prevent the first conductive line 210 and the first electrode 141 or the second conductive line 220 and the second electrode 142 from being disconnected from each other.

In this instance, a center of the bending portion 200P formed at the end of the first and second conductive lines 200 may be positioned between the semiconductor substrate 110 of each of the first and second solar cells and the intercell connector 300 and may protrude toward the back surface of the solar cell module.

Because the bending portion 200P may protrude toward not the front surface of the solar cell module, on which the semiconductor substrate 110 is positioned, but the back surface of the solar cell module, as described above, the bending portion 200P may cause the first and second conductive lines 200 to be thermally expanded in the opposite direction (toward the back surface of the solar cell module) of the semiconductor substrate 110 even if the first and second conductive lines 200 are thermally expanded in the third direction z.

In this instance, as shown in FIG. 18, the end of each of the first and second conductive lines 200 may overlap the intercell connector 300 and may be attached to the intercell connector 300 through the second conductive adhesive layer 350.

As shown in FIG. 19, each of the first and second conductive lines 200 may have an asymmetric shape with respect to both sides of each of first direction central axes Ax1 and Ax2 of the first and second conductive lines 200.

For example, the first conductive line 210 may have an asymmetric shape with respect to both sides of the first direction central axis Ax1 of the first conductive line 210 while having a uniform linewidth w200. Further, the second conductive line 220 may have an asymmetric shape with respect to both sides of the first direction central axis Ax2 of the second conductive line 220 while having a uniform linewidth w200.

For example, each of the first and second conductive lines 200 may have a zigzag shape with respect to both sides of the first direction central axes Ax1 and Ax2.

Namely, as shown in FIG. 19, each of the first and second conductive lines 200 may include a first portion 200P1, that extends in a first diagonal direction S1 crossing the first and second directions x and y based on the first direction central axes Ax1 and Ax2, and a second portion 200P2, that extends in a second diagonal direction S2 different from the first diagonal direction S1.

In other words, each of the first and second conductive lines 200 may be configured in the zigzag shape based on the first direction central axis Ax such that the first and second portions 200P1 and 200P2 are formed in the diagonal direction of the first and second directions x and y. Hence, each of the first and second conductive lines 200 may have the asymmetric shape with respect to both sides of each of the first direction central axes Ax1 and Ax2.

An angle of a portion where the first and second portions 200P1 and 200P2 of each of the first and second conductive lines 200 meet each other may be substantially the same on both sides of the first direction central axis Ax. The first and second portions 200P 1 and 200P2 may have the same length.

In each of the first and second conductive lines 200, a linewidth W200 of each of the first and second portions 200P1 and 200P2 may be 1 mm to 3 mm. A zigzagged width of each of the first and second conductive lines 200 may be 2 mm to 4 mm.

The thermal process may be performed on a portion of each of the first and second conductive lines 200 crossing the first and second electrodes 141 and 142, and thus the first and second conductive lines 200 and the first and second electrodes 141 and 142 may be connected by the first conductive adhesive layer 251.

For example, the first conductive line 210 and the first electrode 141 may cross each other in a portion, in which the first and second portions 200P1 and 200P2 meet each other, and may be connected to each other through the first conductive adhesive layer 251. Further, the second conductive line 220 and the second electrode 142 may cross each other in the center of each of the first and second portions 200P1 and 200P2 and may be connected to each other through the first conductive adhesive layer 251.

The first and second conductive lines 200 may be connected to the first and second electrodes 141 and 142 by performing the thermal process on the first conductive adhesive layer 251. The first and second conductive lines 200 may be thermally expanded during the thermal process and may be thermally contracted while cooling after the thermal process.

A shear stress may be generated in the first and second conductive lines 200 during the thermal process, in which the first and second conductive lines 200 are thermally expanded and contracted. Hence, the first and second conductive lines 200 and the first and second electrodes 141 and 142 may be disconnected, or the semiconductor substrate 110 may bend.

However, in the embodiment of the invention, because the first and second conductive lines 200 have the asymmetric shape with respect to both sides of the first direction central axis Ax as shown in FIG. 19, the embodiment of the invention can prevent the shear stress of the first and second conductive lines 200 from being concentrated in the first direction x and can distribute the shear stress in the first and second diagonal directions S1 and S2. Hence, the disconnection or the bending of the semiconductor substrate 110 can be prevented or minimized.

FIG. 19 illustrates that the angle of a portion, where the first and second portions 200P1 and 200P2 of each of the first and second conductive lines 200 meet each other, is substantially the same on both sides of the first direction central axis Ax, and the first and second portions 200P1 and 200P2 have the same length, by way of example. However, an angle of a portion, where the first and second portions 200P1 and 200P2 of each of the first and second conductive lines 200 meet each other, may be different on both sides of the first direction central axis Ax, and the first and second portions 200P1 and 200P2 may have different lengths.

Figure 20:
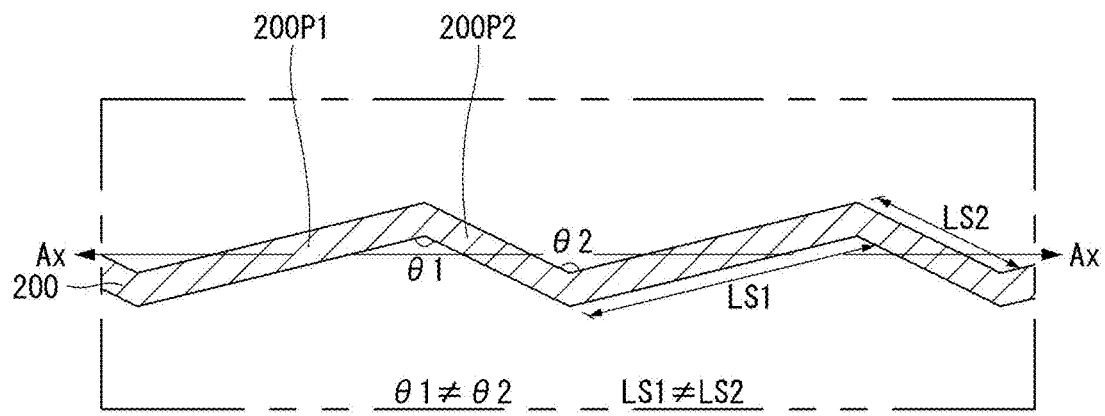
FIG. 20 illustrates a second example of an asymmetric shape of a conductive line in a solar cell module according to an embodiment of the invention.
Figure 20:
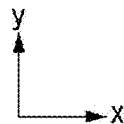

FIG. 20 illustrates a second example of an asymmetric shape of a conductive line in the solar cell module according to the embodiment of the invention.

The first and second electrodes 141 and 142, the first conductive adhesive layer 251, and the insulating layer 252 are not shown in figures subsequent to FIG. 20 for the sake of brevity and ease of reading. In figures subsequent to FIG. 20, only one conductive line 200 is shown, but configuration of the one conductive line 200 may be equally applied to the first and second conductive lines 200.

As shown in FIG. 20, a conductive line 200 may have a zigzag shape. An angle of a portion where first and second portions 200P1 and 200P2 of the conductive line 200 meet each other may be different on both sides of a first direction central axis Ax.

More specifically, a first angle θ1 formed by the first and second portions 200P1 and 200P2 on one side of the first direction central axis Ax may be different from a second angle θ2 formed by the first and second portions 200P1 and 200P2 on the other side of the first direction central axis Ax.

A length LS1 of the first portion 200P1 may be different from a length LS2 of the second portion 200P2.

FIGS. 19 and 20 illustrate that the conductive line 200 includes the first and second portions 200P1 and 200P2 formed in the zigzag shape, by way of example. Other configurations may be used. For example, the conductive line 200 may further include a portion extending in the first direction x, in order to further distribute the shear stress of the conductive line 200. This is described in detail below.

Figure 21:
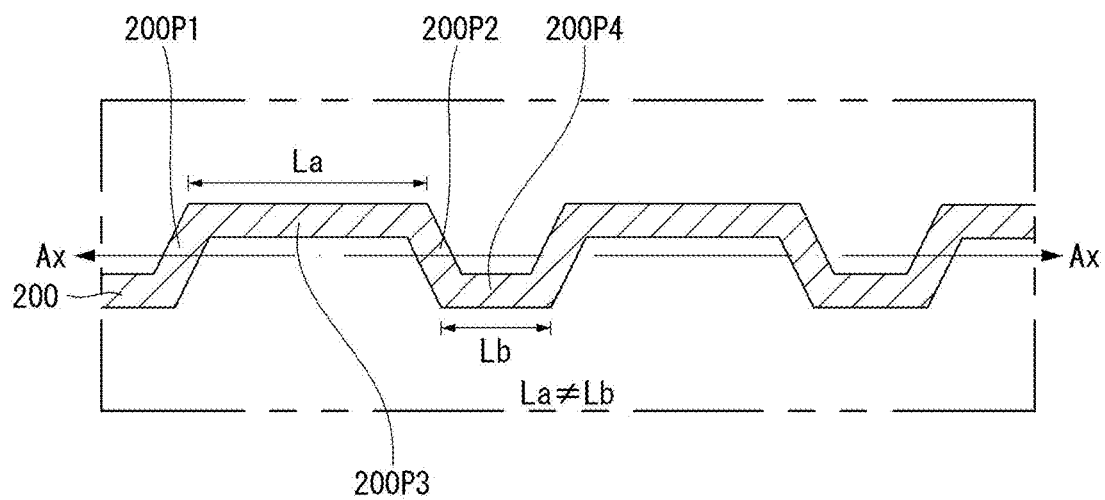
FIG. 21 illustrates a third example of an asymmetric shape of a conductive line in a solar cell module according to an embodiment of the invention.
Figure 21:
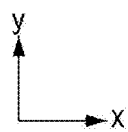

FIG. 21 illustrates a third example of an asymmetric shape of a conductive line in the solar cell module according to the embodiment of the invention.

As shown in FIG. 21, a conductive line 200 may include first and second portions 200P1 and 200P2, that form a zigzag shape, and third and fourth portions 200P3 and 200P4 that are formed in parallel with the first direction x.

More specifically, the conductive line 200 may include the third portion 200P3 extending in the first direction x on one side of the first direction central axis Ax and the fourth portion 200P4 extending in the first direction x on the other side of the first direction central axis Ax.

Each of the third and fourth portions 200P3 and 200P4 may be positioned between the first and second portions 200P1 and 200P2, and both ends of each of the third and fourth portions 200P3 and 200P4 may be connected to the first and second portions 200P1 and 200P2. Further, a length La of the third portion 200P3 may be different from a length Lb of the fourth portion 200P4. FIG. 21 illustrates that the length La of the third portion 200P3 is greater than the length Lb of the fourth portion 200P4 by way of example. However, the length Lb of the fourth portion 200P4 may be greater than the length La of the third portion 200P3.

Further, the conductive line 200 of the zigzag shape may further include a hole, in order to further reduce the shear stress. This is described in detail below.

Figure 22:
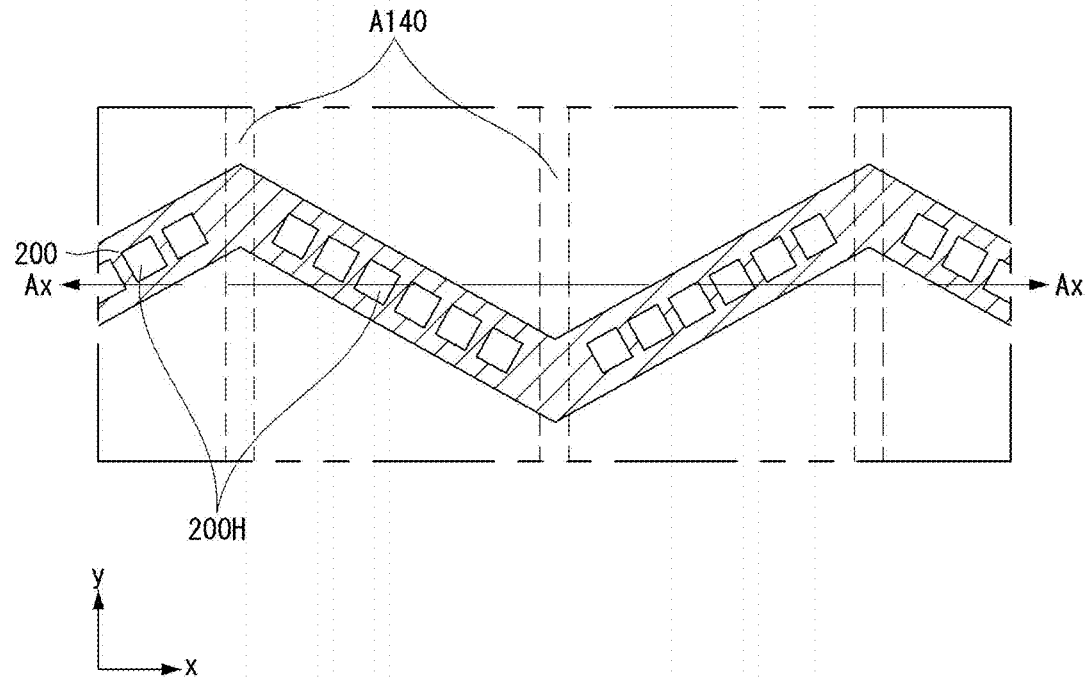
FIG. 22 illustrates a fourth example of an asymmetric shape of a conductive line in a solar cell module according to an embodiment of the invention.

FIG. 22 illustrates a fourth example of an asymmetric shape of a conductive line in the solar cell module according to the embodiment of the invention.

As shown in FIG. 22, a conductive line 200 may have an asymmetric shape (for example, a zigzag shape) with respect to both sides of a first direction central axis Ax. The conductive line 200 of the zigzag shape may include a plurality of holes 200H.

The plurality of holes 200H may be arranged in the conductive line 200 except a formation area A140 of the electrode electrically connected to the conductive line 200.

When the holes 200H are positioned in the formation area A140 of the electrode electrically connected to the conductive line 200, a physical adhesive strength of the first conductive adhesive layer 251 may be reduced, and a resistance between the conductive line 200 and the electrode may increase.

Accordingly, the holes 200H according to the embodiment of the invention may be formed in the conductive line 200 except the area A140 of the conductive line 200, in which the electrode is positioned, in order to prevent the above problems.

In FIG. 22, the meaning of the electrode electrically connected to the conductive line 200 is as follows.

In the embodiment of the invention, the first conductive line 210 is electrically connected to the first electrode 141 and is insulated from the second electrode 142. Therefore, when the conductive line 200 shown in FIG. 22 is the first conductive line 210, the electrode electrically connected to the conductive line 200 is the first electrode 141. When the conductive line 200 shown in FIG. 22 is the second conductive line 220, the electrode electrically connected to the conductive line 200 is the second electrode 142.

So far, the embodiment of the invention described that the conductive line 200 has the asymmetric shape (for example, the zigzag shape) with respect to both sides of the first direction central axis Ax, by way of example. Unlike this, the conductive line 200 according to the embodiment of the invention may have a uniform linewidth, extend in the first direction x, and include holes, and an arrangement and a shape of the holes may be asymmetric with respect to both sides of the first direction central axis Ax. This is described in detail below.

Figure 23:
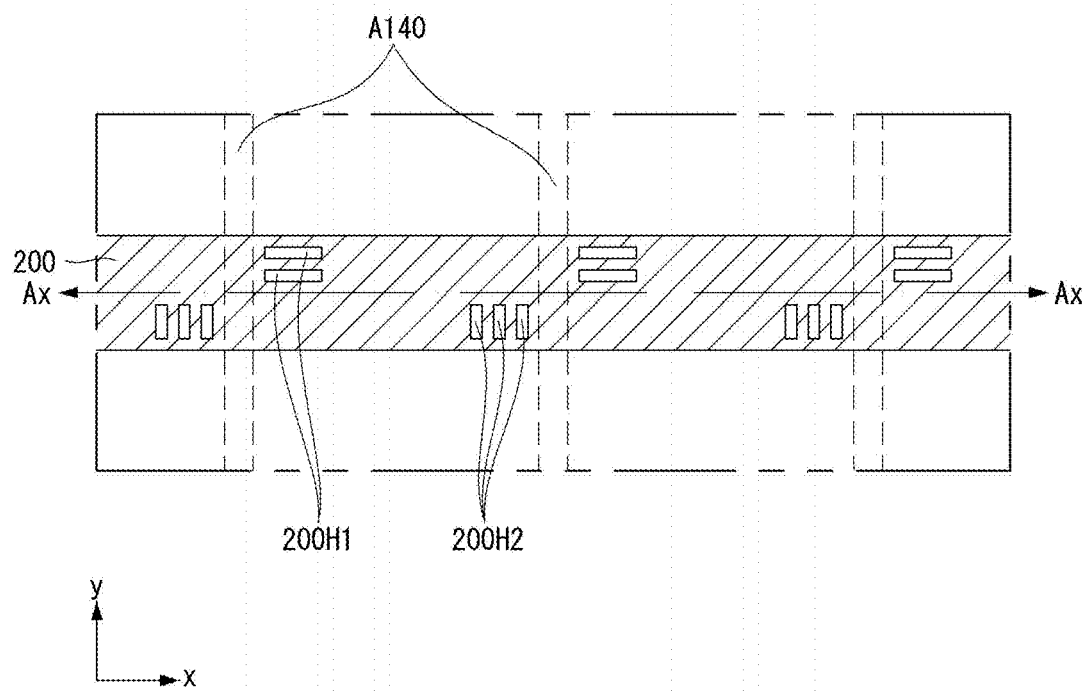
FIG. 23 illustrates a fifth example of an asymmetric shape of a conductive line in a solar cell module according to an embodiment of the invention.

FIG. 23 illustrates a fifth example of an asymmetric shape of a conductive line in the solar cell module according to the embodiment of the invention.

As shown in FIG. 23, a conductive line 200 may have a uniform linewidth extending along the first direction x and may include holes 200H1 and 200H2.

The holes 200H1 and 200H2 may be arranged in the conductive line 200 except a formation area A140 of the electrode electrically connected to the conductive line 200 of a zigzag shape.

The holes 200H1 and 200H2 of the conductive line 200 may be positioned in an asymmetric portion with respect to both sides of a first direction central axis Ax.

The holes 200H1 and 200H2 may have a shape extending in the first direction x or a shape extending in the second direction y and may be formed asymmetrically with respect to both sides of the first direction central axis Ax.

In this instance, the conductive line 200 has an asymmetric shape with respect to both sides of the first direction central axis Ax, and thus a shear stress of the conductive line 200 can be reduced.

FIG. 23 illustrates that the conductive line 200 includes the holes 200H1 and 200H2 and have the uniform linewidth extending along the first direction x, by way of example. However, the linewidth of the conductive line 200 may periodically change along the first direction x. This is described in detail below.

Figure 24:
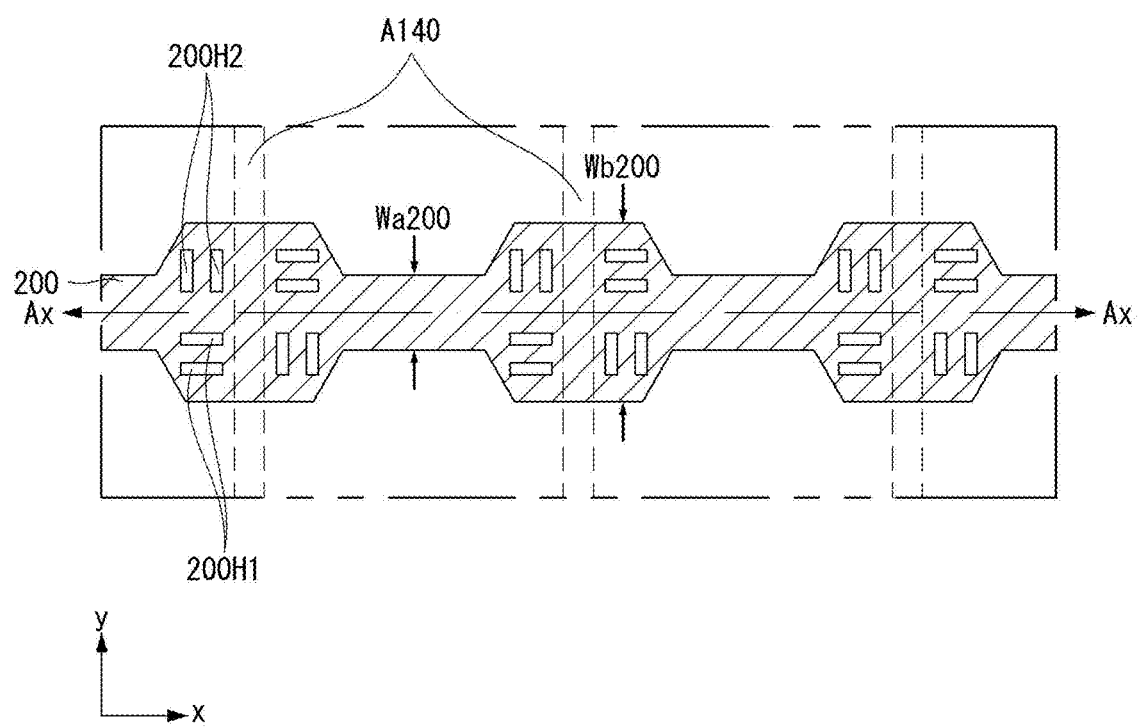
FIG. 24 illustrates a sixth example of an asymmetric shape of a conductive line in a solar cell module according to an embodiment of the invention.

FIG. 24 illustrates a sixth example of an asymmetric shape of a conductive line in the solar cell module according to the embodiment of the invention.

As shown in FIG. 24, a conductive line 200 may include holes 200H1 and 200H2 that are formed asymmetrically with respect to both sides of a first direction central axis Ax. The conductive line 200 may have widths Wa200 and Wb200 that periodically increase or decrease along the first direction x.

Positions or shapes of the holes 200H1 and 200H2 may be asymmetric with respect to both sides of the first direction central axis Ax.

FIG. 24 illustrates that the shapes of the holes 200H1 and 200H2 are asymmetric with respect to both sides of the first direction central axis Ax, by way of example.

The width of the conductive line 200 may periodically increase or decrease along the first direction x. The width Wb200 of the conductive line 200 crossing a formation area A140 of the electrode electrically connected to the conductive line 200 may be greater than the width Wa200 of the conductive line 200 that does not cross the formation area A140.

Hence, the embodiment of the invention relatively increases the width Wb200 of the conductive line 200 crossing the formation area A140 of the electrode, which will be electrically connected to the conductive line 200, while reducing a shear stress of the conductive line 200, thereby further reducing a contact resistance between the conductive line 200 and the electrode.

As described above, the solar cell module according to the embodiment of the invention includes the first and second conductive lines having the asymmetric shape with respect to both sides of the first direction central axis, thereby further reducing the shear stress of the first and second conductive lines.

Hereinafter, an example of the intercell connector formed in an asymmetric shape is described.

Figure 25:
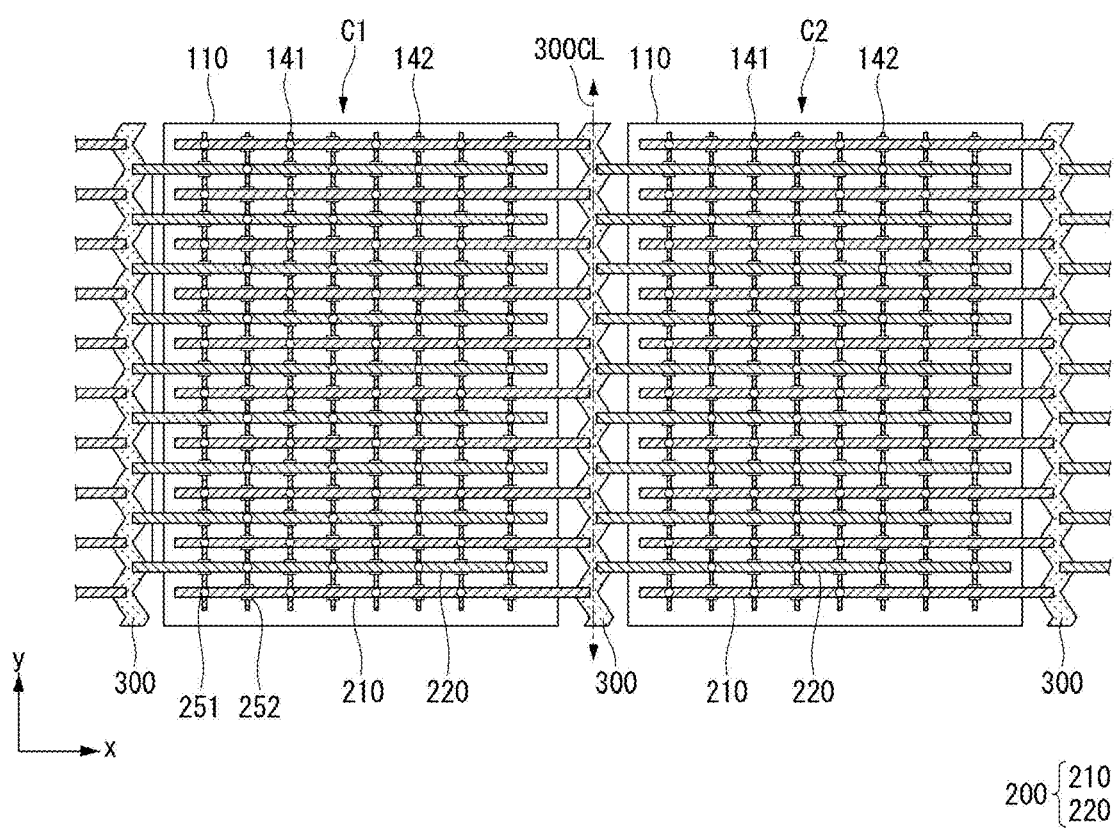
FIGS. 25 and 26 illustrate a first example of an intercell connector in a solar cell module according to an embodiment of the invention.
Figure 26:
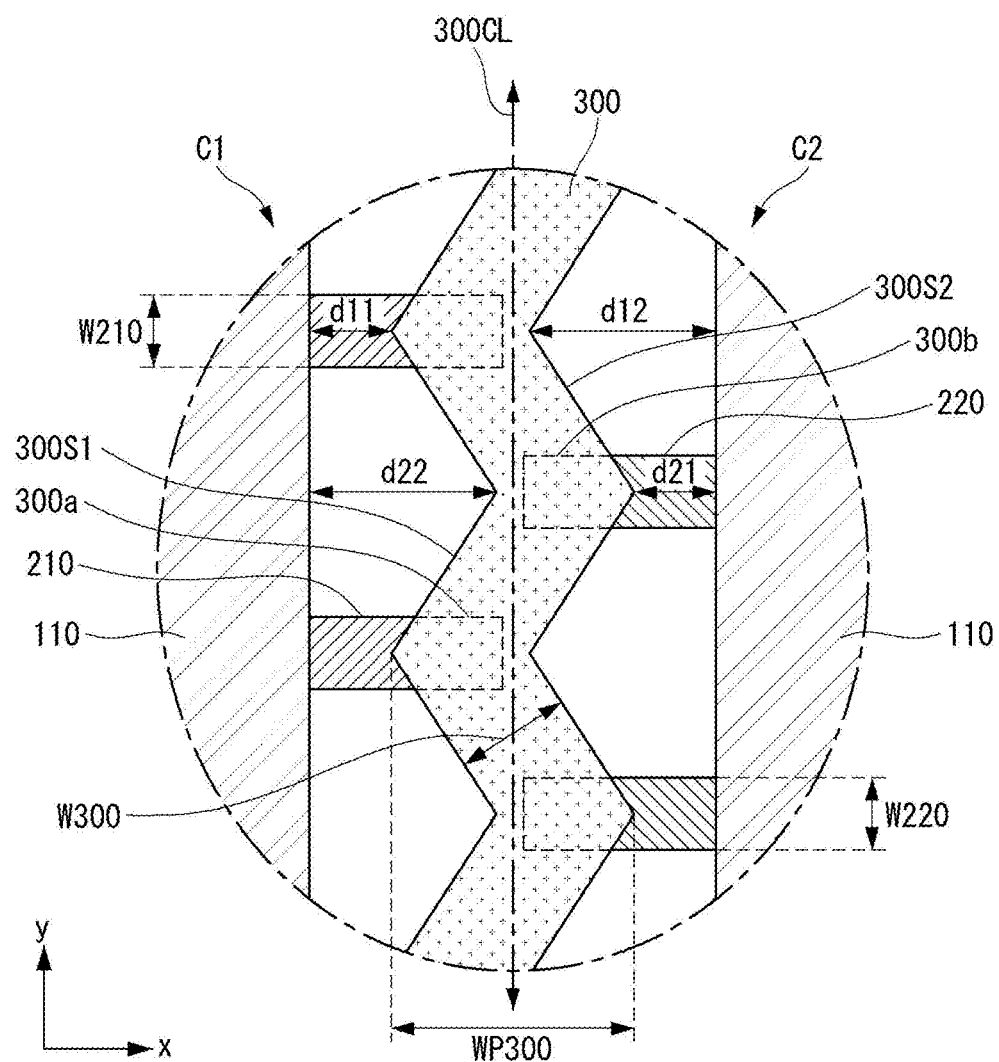

FIGS. 25 and 26 illustrate a first example of an intercell connector in the solar cell module according to the embodiment of the invention.

More specifically, FIG. 25 partially illustrates the back surface of the solar cell module including an intercell connector of an asymmetric shape. FIG. 26 is a partially enlarged view of an intercell connector shown in FIG. 25.

As shown in FIG. 25, a planar shape of an intercell connector 300 included in the solar cell module according to the embodiment of the invention may have an asymmetric shape based on a central line 300CL parallel to the second direction y.

As the planar shape of the intercell connector 300 according to the embodiment of the invention has the asymmetric shape based on the central line 300CL as described above, a shear stress generated in first and second conductive lines 210 and 220 may be reduced.

More specifically, as shown in FIG. 25, a first connection portion between the first conductive line 210 connected to the first solar cell C1 and the intercell connector 300 and a second connection portion between the second conductive line 220 connected to the second solar cell C2 and the intercell connector 300 may be alternately positioned on the intercell connector 300 along the second direction y corresponding to a longitudinal direction of the intercell connector 300.

When the first and second connection portions are alternately positioned on a back surface of the intercell connector 300 along the second direction y as described above, the thermal expansion may be generated in the first and second conductive lines 210 and 220 during a process for manufacturing the solar cell or during the use of the solar cell module. The planar shape of the intercell connector 300 may bend in the first direction x corresponding to the longitudinal direction of the first and second conductive lines 210 and 220 because of a shear stress of the first and second conductive lines 210 and 220.

When the deformation (for example, the bending) is generated in the intercell connector 300 as described above, an adhesive strength between the intercell connector 300 and the first and second conductive lines 210 and 220 may be reduced. If the deformation is generated in the shape of the intercell connector 300, it may be impossible to restore the shape of the intercell connector 300 to an original state. Therefore, as a reduction state of the adhesive strength continues, a reduction in the efficiency of the solar cell module or a damage of the solar cell module may be caused in the end.

However, when the planar shape of the intercell connector 300 has the asymmetric shape based on the central line 300CL parallel to the second direction y in each of the first and second connection portions as shown in FIG. 25, a reduction in the adhesive strength between the intercell connector 300 and the first and second conductive lines 210 and 220 can be minimized because of the asymmetric shape of the intercell connector 300 even if the shape of the intercell connector 300 is deformed.

The planar shape of the intercell connector 300 according to the embodiment of the invention may have at least one of a slit in which a length is longer than a width asymmetrically based on the central line 300CL, a hole in which a width and a length are the same as each other, a protrusion, a depression, or a zigzag shape.

For example, FIG. 25 illustrates an example where the planar shape of the intercell connector 300 has the zigzag shape. However, the planar shape of the intercell connector 300 may have at least one of the slit, the hole, the protrusion, the depression, or the zigzag shape.

Hereinafter, various shapes of the intercell connector 300 having the asymmetric planar shape are described in detail.

More specifically, as shown in FIG. 26, first connection portions 300a and second connection portions 300b may be alternately positioned on the intercell connector 300 along the second direction y corresponding to the longitudinal direction of the intercell connector 300.

A planar shape of the intercell connector 300 according to the embodiment of the invention may have the asymmetric shape based on the central line 300CL in the first connection portion 300a and may have the asymmetric shape based on the central line 300CL in the second connection portion 300b.

For example, the planar shape of the intercell connector 300 may have a zigzag shape of an asymmetric structure based on the central line 300CL parallel to the second direction y. Namely, the planar shape of the intercell connector 300 of the zigzag shape may be configured such that one side of the intercell connector 300 protrudes based on the central line 300CL and the other side is depressed based on the central line 300CL.

More specifically, a first side 300S 1 of the intercell connector 300 adjacent to the first connection portion 300a may protrude toward the first solar cell C1 based on the central line 300CL, and a second side 300S2 of the intercell connector 300 adjacent to the first connection portion 300a may be depressed toward the central line 300CL.

Further, the second side 300S2 of the intercell connector 300 adjacent to the second connection portion 300b may protrude toward the second solar cell C2, and the first side 300S1 of the intercell connector 300 adjacent to the second connection portion 300b may be depressed toward the central line 300CL.

Accordingly, distances d11 and d22 between the first side 300S1 of the intercell connector 300 and the semiconductor substrate 110 of the first solar cell C1 may be different from distances d12 and d21 between the second side 300S2 of the intercell connector 300 positioned opposite the first side 300S 1 and the semiconductor substrate 110 of the second solar cell C2.

In the embodiment disclosed herein, the first and second connection portions 300a and 300b indicate portions of the first and second conductive lines 210 and 220 connected to the intercell connector 300. Further, the first side 300S1 indicates a side of the intercell connector 300 next to the first solar cell C1, to which the first conductive line 210 is connected, and the second side 300S2 indicates a side of the intercell connector 300 next to the second solar cell C2, to which the second conductive line 220 is connected.

Accordingly, the first connection portion 300a of the intercell connector 300, to which the first conductive line 210 of the first solar cell C1 is connected, may be positioned closer to the distance between the first side 300S1 of the intercell connector 300 and the semiconductor substrate 110 of the first solar cell C1 than the distance between the second side 300S2 of the intercell connector 300 and the semiconductor substrate 110 of the second solar cell C2.

Further, the second connection portion 300b of the intercell connector 300, to which the second conductive line 220 of the second solar cell C2 is connected, may be positioned closer to the distance between the second side 300S2 of the intercell connector 300 and the semiconductor substrate 110 of the second solar cell C2 than the distance between the first side 300S1 of the intercell connector 300 and the semiconductor substrate 110 of the first solar cell C1.

Accordingly, the intercell connector 300 in the first connection portion 300a may be relatively positioned closer to the first solar cell C1 than the second solar cell C2, and the intercell connector 300 in the second connection portion 300b may be relatively positioned closer to the second solar cell C2 than the first solar cell C1.

As described above, in the solar cell module according to the embodiment of the invention, the intercell connector 300 has the zigzag shape of the asymmetric structure, the intercell connector 300 of the zigzag shape in the first connection portion 300a protrudes toward the first solar cell C1, to which the first conductive line 210 is connected, based on the central line 300CL, and the intercell connector 300 of the zigzag shape in the second connection portion 300b protrudes toward the second solar cell C2, to which the second conductive line 220 is connected, based on the central line 300CL. Hence, the shear stress generated in the first and second conductive lines 210 and 220 can be reduced, the deformation of the intercell connector 300 can be minimized, and a reduction in the adhesive strength between the intercell connector 300 and the first and second conductive lines 210 and 220 can be minimized even if the intercell connector 300 is deformed.

In this instance, a linewidth W300 of the intercell connector 300 having the zigzag shape may be 1 mm to 3 mm in consideration of a distance between the first and second solar cells C1 and C2 and sizes of the first and second connection portions 300a and 300b and may be uniform within a margin of error of 10%.

A first direction width WP300 from protruding one side to the protruding other side of the intercell connector 300 of the zigzag shape may be 2 mm to 4 mm.

FIGS. 25 and 26 illustrate that the planar shape of the intercell connector 300 has the zigzag shape of the asymmetric structure, by way of example. Other asymmetric shapes may be used for the intercell connector 300.

Hereinafter, various examples of the planar shape of the intercell connector 300 having the asymmetric shape are described in detail with reference to FIGS. 27 to 33.

Structures and components identical or equivalent to those described above are omitted in FIGS. 27 to 33, and a difference between them is mainly described.

Figure 27:
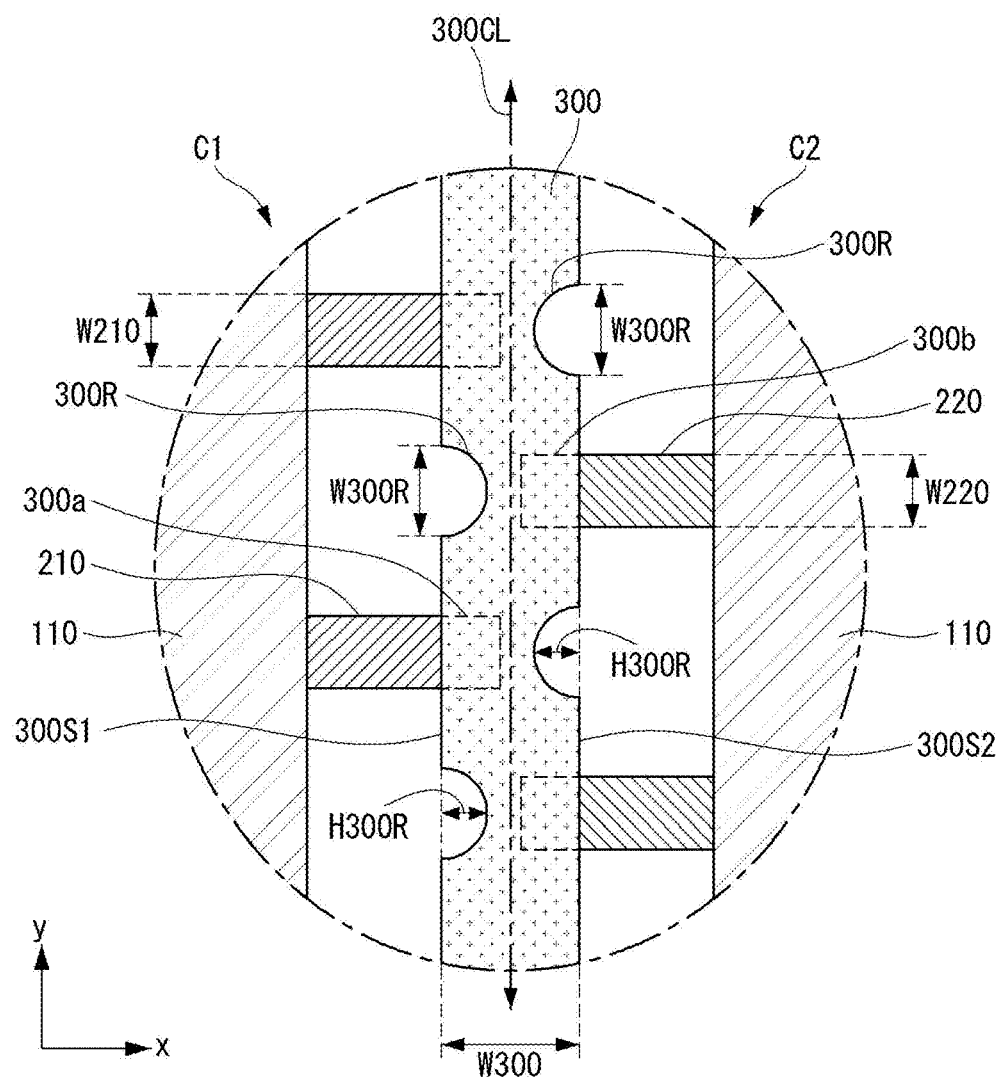
FIG. 27 is an enlarged view illustrating a second example of an intercell connector in a solar cell module according to an embodiment of the invention.

FIG. 27 is an enlarged view illustrating a second example of an intercell connector in the solar cell module according to the embodiment of the invention.

More specifically, FIG. 27 is an enlarged view illustrating a planar shape of an intercell connector including a depression of an asymmetric structure when viewed from the front surface of the solar cell module according to the embodiment of the invention.

As shown in FIG. 27, a planar shape of an intercell connector 300 extended in the second direction y may include a plurality of depressions 300R that are arranged asymmetrically based on a central line 300CL.

More specifically, the depression 300R depressed toward the central line 300CL may be formed on the second side 300S2 of the intercell connector 300 corresponding to the first connection portion 300a, and may not be formed on the first side 300S1 in the first connection portion 300a.

Further, the depression 300R depressed toward the central line 300CL may be formed on the first side 300S 1 of the intercell connector 300 corresponding to the second connection portion 300b, and may not be formed on the second side 300S2 in the second connection portion 300b.

As shown in FIG. 27, a planar shape of the depression 300R included in the intercell connector 300 may have a curved shape. For example, a semicircle or an oval may be used for the depression 300R.

Alternatively, unlike FIG. 27, the depression 300R may have a triangular shape, a rectangular shape, or a polygon shape.

A maximum depressed depth H300R of the depression 300R may be equal to or less than ½ of a linewidth W300 of the intercell connector 300. For example, the maximum depressed depth H300R may be 0.5 mm to 1.5 mm.

Further, a maximum width W300R of the depression 300R in the second direction y may be substantially equal to or greater than linewidths W210 and W220 of the first and second conductive lines 210 and 220. For example, the maximum width W300R may be 1 mm to 3 mm.

Figure 28:
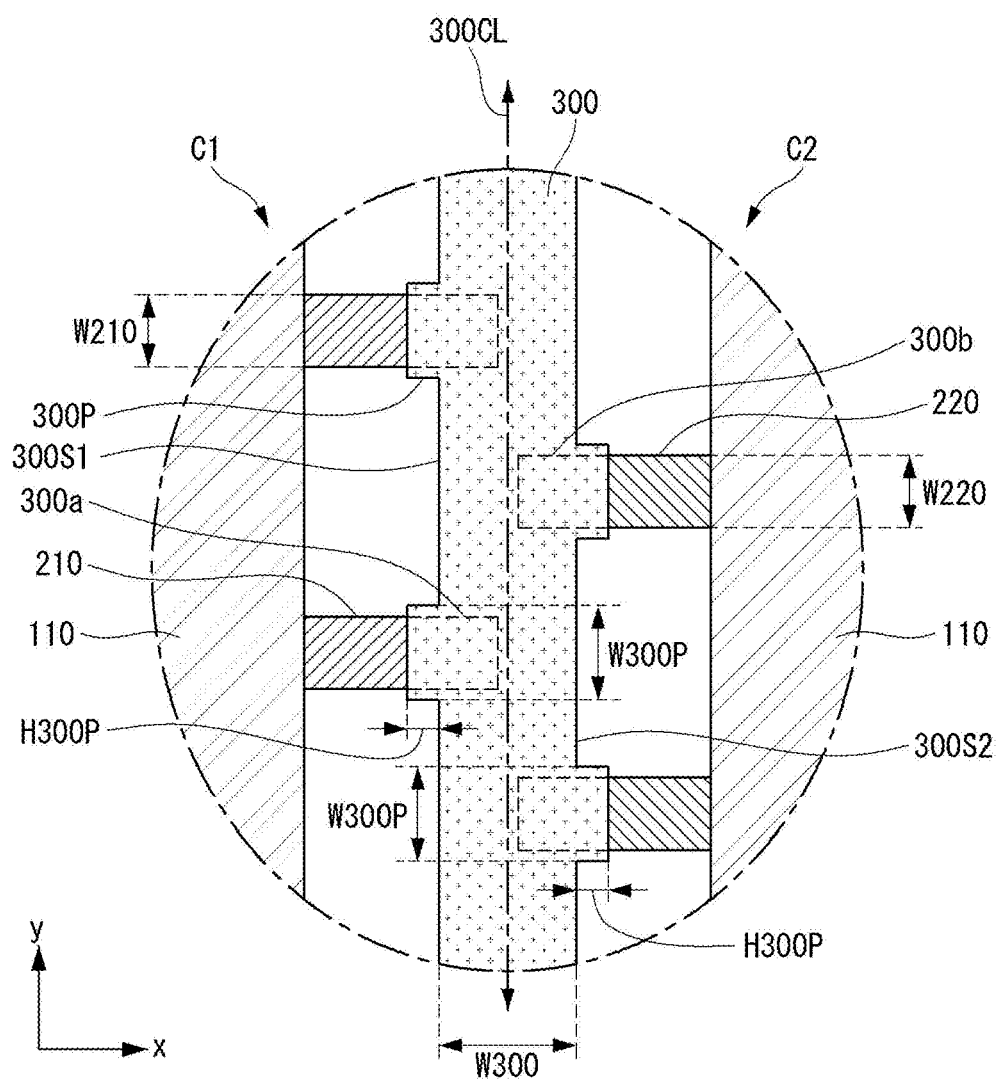
FIG. 28 is an enlarged view illustrating a third example of an intercell connector in a solar cell module according to an embodiment of the invention.

FIG. 28 is an enlarged view illustrating a third example of an intercell connector in the solar cell module according to the embodiment of the invention.

More specifically, FIG. 28 is an enlarged view illustrating a planar shape of an intercell connector including a protrusion of an asymmetric structure when viewed from the front surface of the solar cell module according to the embodiment of the invention.

As shown in FIG. 28, a planar shape of an intercell connector 300 extended in the second direction y may include a plurality of protrusions 300P that are arranged asymmetrically based on a central line 300CL.

More specifically, the protrusion 300P protruding toward the first solar cell C1 may be formed on the first side 300S1 of the intercell connector 300 in the first connection portion 300a, and may not be formed on the second side 300S2 corresponding to the first connection portion 300a.

Further, the protrusion 300P protruding toward the second solar cell C2 may be formed on the second side 300S2 of the intercell connector 300 in the second connection portion 300b, and may not be formed on the first side 300S1 corresponding to the second connection portion 300b.

FIG. 28 illustrates the protrusion 300P of a rectangular shape by way of example. Other shapes may be used. For example, a curved shape, such as a semicircle and an oval, or a triangular shape may be used.

A maximum protruding length H300P of the protrusion 300P may be equal to or less than ½ of a linewidth W300 of the intercell connector 300. For example, the maximum protruding length H300P may be 0.5 mm to 1.5 mm.

Further, a maximum width W300P of the protrusion 300P in the second direction y may be substantially equal to or greater than linewidths W210 and W220 of the first and second conductive lines 210 and 220. For example, the maximum width W300P may be 1 mm to 3 mm.

Figure 29:
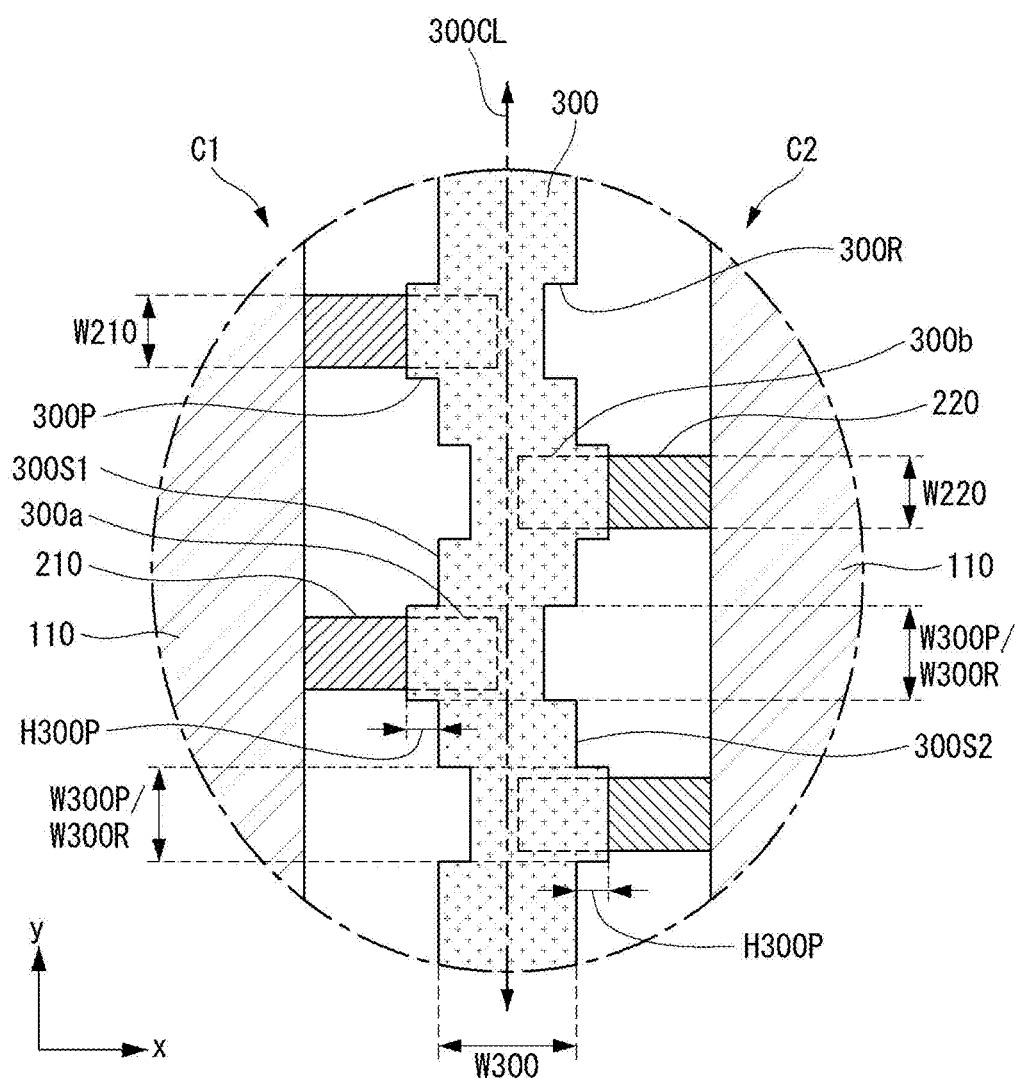
FIG. 29 is an enlarged view illustrating a fourth example of an intercell connector in a solar cell module according to an embodiment of the invention.

FIG. 29 is an enlarged view illustrating a fourth example of an intercell connector in the solar cell module according to the embodiment of the invention.

More specifically, FIG. 29 is an enlarged view illustrating a planar shape of an intercell connector including a protrusion and a depression of an asymmetric structure when viewed from the front surface of the solar cell module according to the embodiment of the invention.

As shown in FIG. 29, a planar shape of an intercell connector 300 extended in the second direction y may include a plurality of protrusions 300P and depressions 300R that are arranged asymmetrically based on a central line 300CL.

More specifically, the protrusion 300P protruding toward the first solar cell C1 may be formed on the first side 300S1 of the intercell connector 300 in the first connection portion 300a. The depression 300R depressed toward the central line 300CL may be formed on the second side 300S2 corresponding to the first connection portion 300a.

Further, the protrusion 300P protruding toward the second solar cell C2 may be formed on the second side 300S2 of the intercell connector 300 in the second connection portion 300b. The depression 300R depressed toward the central line 300CL may be formed on the first side 300S1 corresponding to the second connection portion 300b.

FIG. 29 illustrates the protrusion 300P and the depression 300R each having a rectangular shape by way of example. Other shapes, for example, a curved shape may be used. A width and a protruding length or a depressed depth of the protrusion 300P and the depression 300R in the second direction y may be substantially the same as those described with reference to FIGS. 27 and 28.

FIGS. 27 to 29 illustrate that the protrusion 300P or the depression 300R is formed on the first side 300S1 and the second side 300S2 of the intercell connector 300, by way of example. Unlike this, the first side 300S1 and the second side 300S2 of the intercell connector 300 may be formed in a straight line, and the intercell connector 300 may include slits or holes that are arranged asymmetrically.

This is described in detail below.

Figure 30:
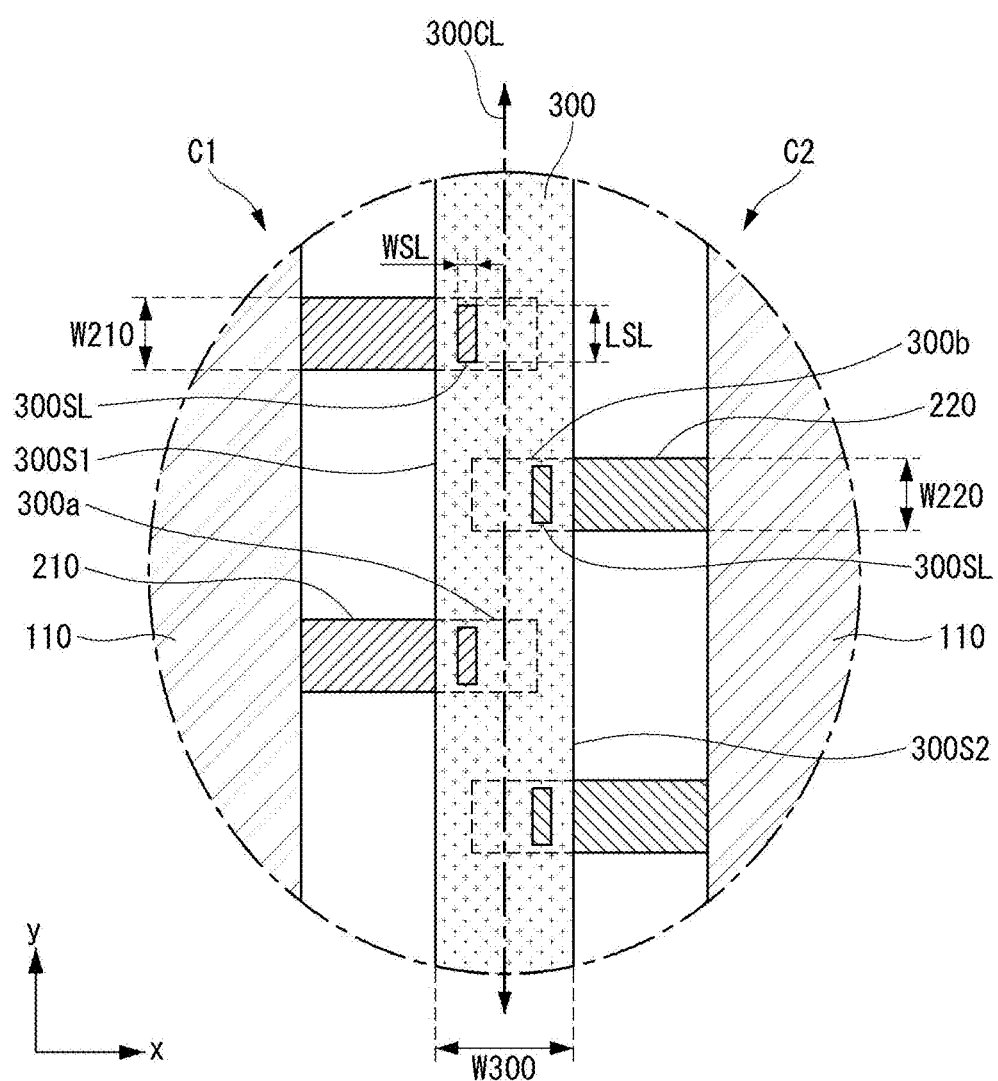
FIGS. 30 to 32 are enlarged views illustrating a fifth example of an intercell connector in a solar cell module according to an embodiment of the invention.
Figure 31:
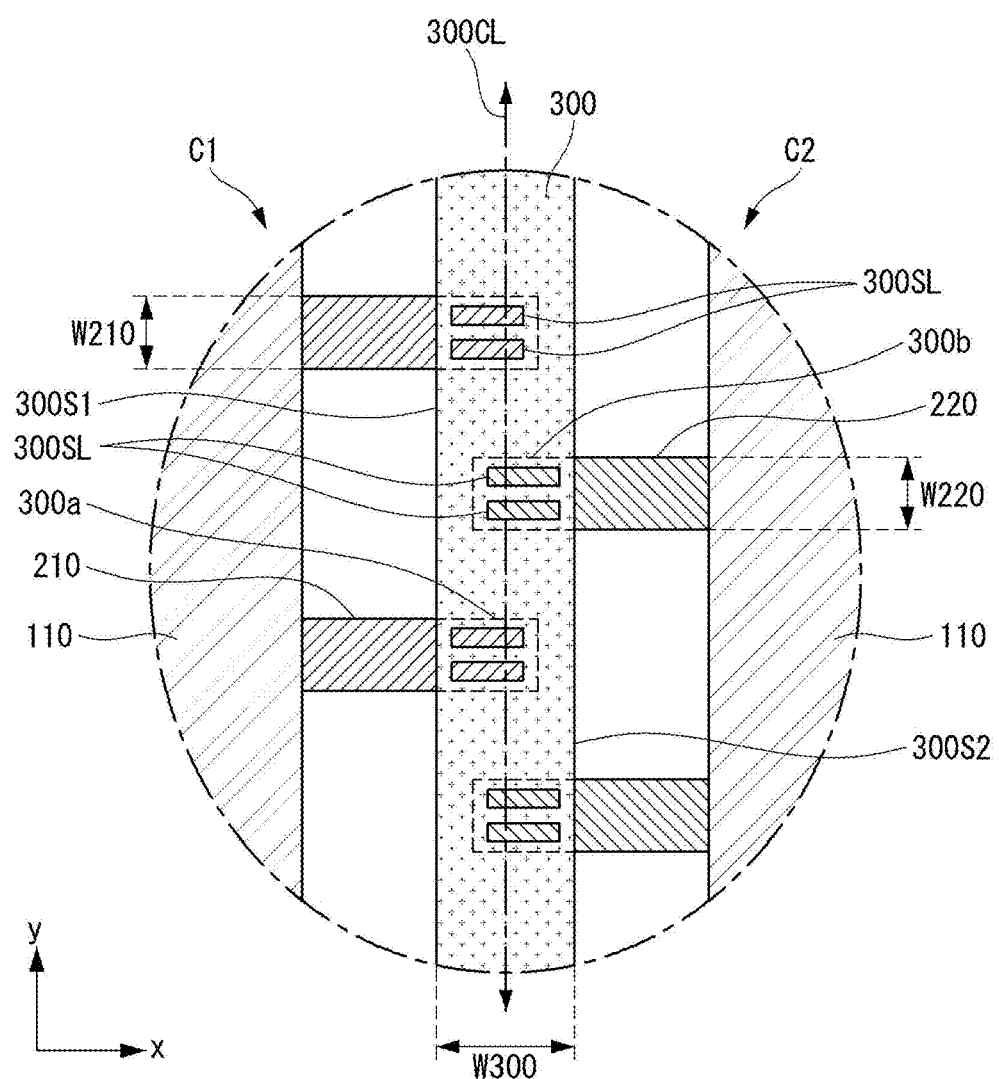
Figure 32:
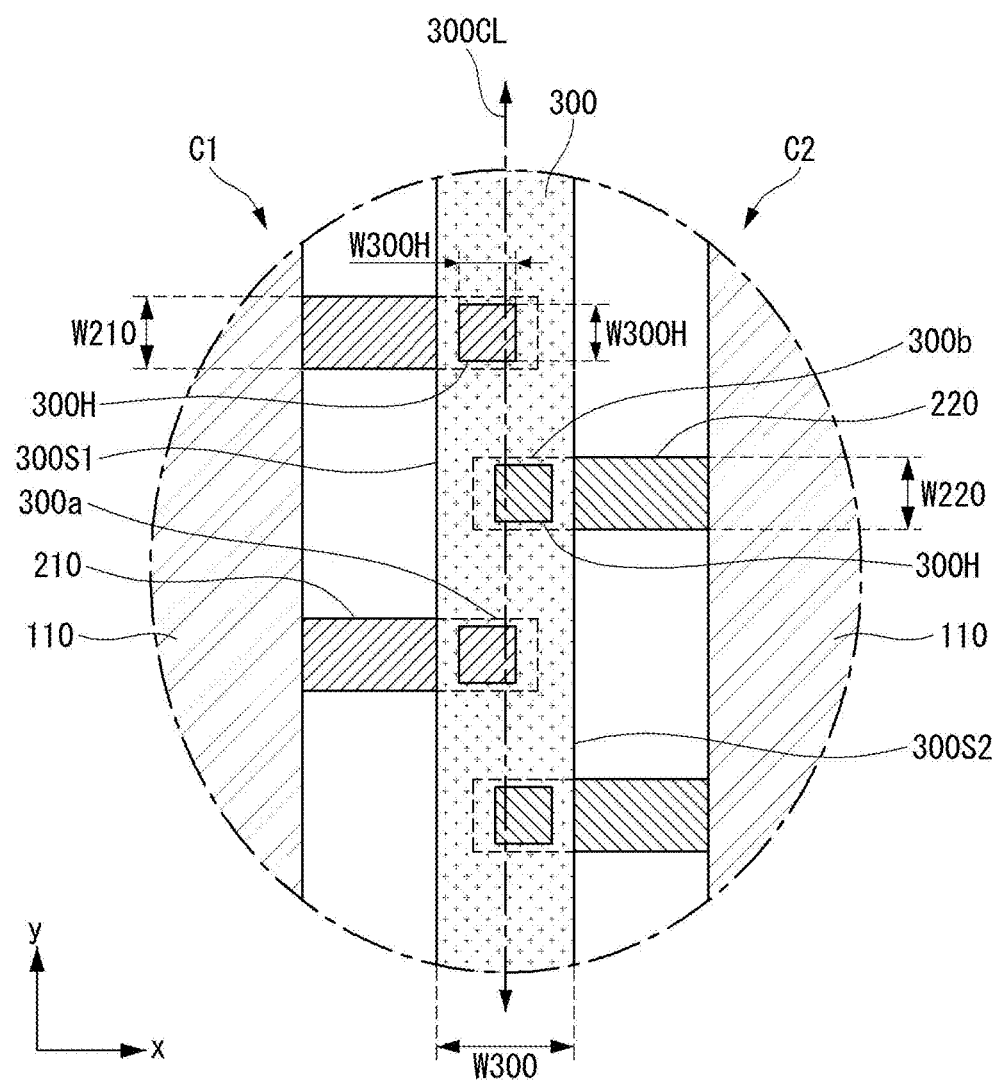

FIGS. 30 to 32 are enlarged views illustrating a fifth example of an intercell connector in the solar cell module according to the embodiment of the invention.

More specifically, FIGS. 30 to 32 are enlarged views of an intercell connector including a slit or a hole when viewed from the front surface of the solar cell module according to the embodiment of the invention.

As shown in FIG. 30, a planar shape of an intercell connector 300 may include a plurality of slits 300SL that are arranged asymmetrically based on a central line 300CL.

In FIGS. 30 to 32, a first side 300S1 and a second side 300S2 of the intercell connector 300 may be formed in a straight line, and a linewidth W300 of the intercell connector 300 may be uniform. A longitudinal direction of the slit 300SL may be the second direction y.

The slit 300SL may be formed in a portion adjacent to the first side 300S1 of the intercell connector 300 based on the central line 300CL in the first connection portion 300a, and may not be formed in a portion adjacent to the second side 300S2 of the intercell connector 300 based on the central line 300CL.

Further, the slit 300SL may be formed in a portion adjacent to the second side 300S2 of the intercell connector 300 based on the central line 300CL in the second connection portion 300b, and may not be formed in a portion adjacent to the first side 300S1 of the intercell connector 300 based on the central line 300CL.

A linewidth WSL of the slit 300SL may be 0.2 mm to 0.5 mm. A length LSL of the slit 300SL in the second direction y may be less than or greater than linewidths W210 and W220 of the first and second conductive lines 210 and 220. For example, the length LSL of the slit 300SL may be 1 mm to 2 mm.

Even if a shear stress is applied to the intercell connector 300 by the first and second conductive lines 210 and 220, a space formed by the slit 300SL may serve as a buffer, reducing a deformation of the intercell connector 300.

FIG. 30 illustrates that one slit 300SL is formed in each of the first and second connection portions 300a and 300b, by way of example. Unlike FIG. 30, the plurality of slits 300SL may be formed in each of the first and second connection portions 300a and 300b.

Further, FIG. 30 illustrates that the longitudinal direction of the slit 300SL is the second direction y, by way of example. Unlike FIG. 30, the slit 300SL may be extended in the first direction x as shown in FIG. 31.

As shown in FIG. 32, the intercell connector 300 may include a plurality of holes 300H that are arranged asymmetrically based on the central line 300CL. A width and a length of each hole 300H may be the same as each other.

The hole 300H may be formed in a portion adjacent to the first side 300S1 of the intercell connector 300 based on the central line 300CL in the first connection portion 300a, and may not be formed in a portion adjacent to the second side 300S2 of the intercell connector 300 based on the central line 300CL.

Further, the hole 300H may be formed in a portion adjacent to the second side 300S2 of the intercell connector 300 based on the central line 300CL in the second connection portion 300b, and may not be formed in a portion adjacent to the first side 300S1 of the intercell connector 300 based on the central line 300CL.

A width or a length W300H of the hole 300H may be less than or greater than linewidths W210 and W220 of the first and second conductive lines 210 and 220. For example, the width or the length W300H of the hole 300H may be 1.5 mm to 2.5 mm.

So far, FIGS. 30 to 32 illustrate that the intercell connector 300 includes the slits 300SL or the holes 300H, that are arranged asymmetrically, in a state where the linewidth W300 of the intercell connector 300 is uniform, by way of example. Unlike this, the slits 300SL or the holes 300H may be arranged asymmetrically in the intercell connector 300 in a state where the linewidth W300 of the intercell connector 300 increases or decreases along the second direction y.

This is described in detail below with reference to FIG. 33.

Figure 33:
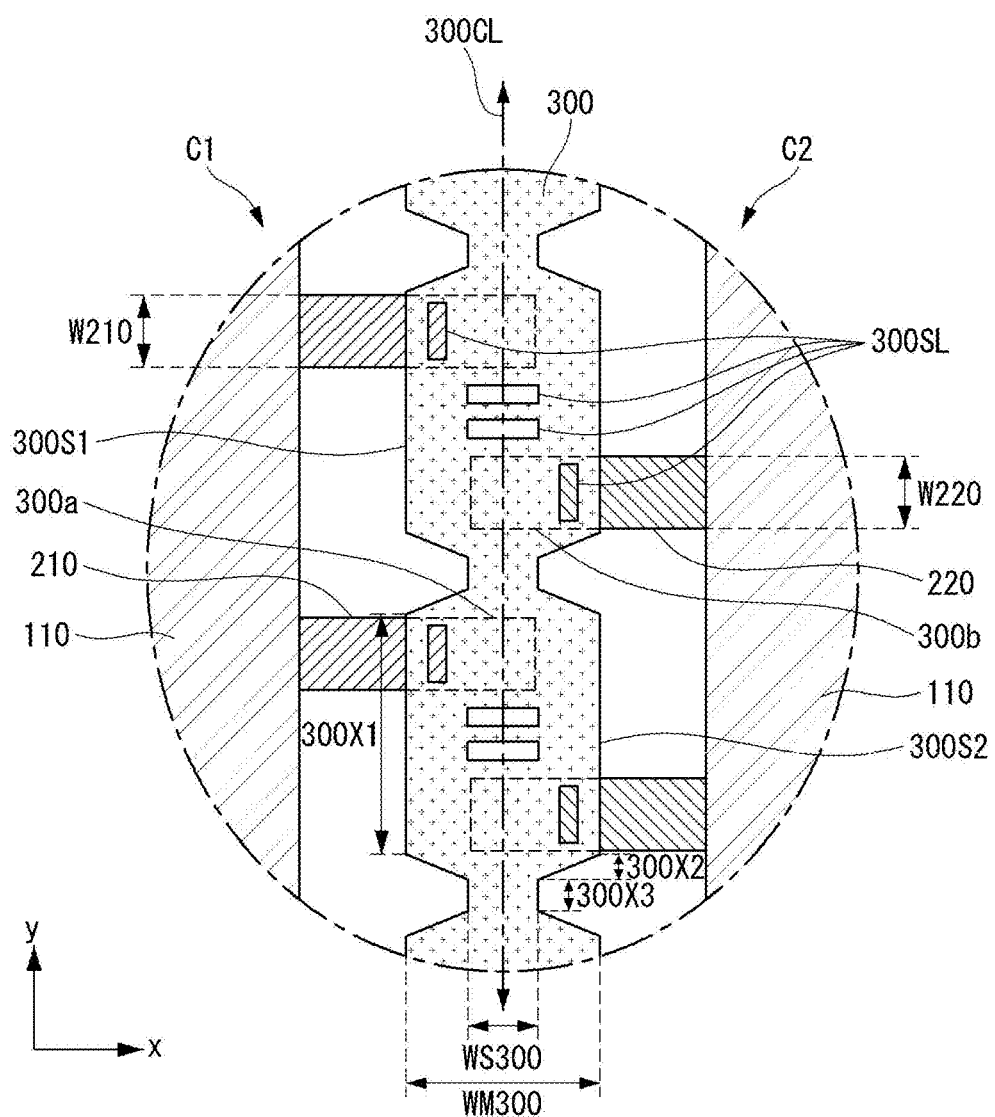
FIG. 33 is an enlarged view illustrating a sixth example of an intercell connector in a solar cell module according to an embodiment of the invention.

FIG. 33 is an enlarged view illustrating a sixth example of an intercell connector in the solar cell module according to the embodiment of the invention.

More specifically, FIG. 33 is an enlarged view of an intercell connector, in which slits are arranged asymmetrically and a linewidth of the intercell connector increases or decreases along the second direction, when viewed from the front surface of the solar cell module according to the embodiment of the invention.

As shown in FIG. 33, in a planar shape of an intercell connector 300 according to the embodiment of the invention, a linewidth of the intercell connector 300 may increase or decrease along the second direction y, and slits 300SL may be arranged asymmetrically in the intercell connector 300.

The slit 300SL extended in the second direction y may be formed in a portion adjacent to the first side 300S1 of the intercell connector 300 based on the central line 300CL in the first connection portion 300a, and may not be formed in a portion adjacent to the second side 300S2 of the intercell connector 300 based on the central line 300CL.

Further, the slit 300SL extended in the second direction y may be formed in a portion adjacent to the second side 300S2 of the intercell connector 300 based on the central line 300CL in the second connection portion 300b, and may not be formed in a portion adjacent to the first side 300S1 of the intercell connector 300 based on the central line 300CL.

The slit 300SL extended in the first direction x may be formed between the first and second connection portions 300a and 300b of the intercell connector 300.

FIG. 33 illustrates that the slit 300SL is formed in the first and second connection portions 300a and 300b of the intercell connector 300, by way of example. Unlike FIG. 33, holes 300H instead of the slits 300SL may be formed in the first and second connection portions 300a and 300b.

In FIG. 33, a length and a width of each slit 300SL may be substantially the same as those illustrated in FIGS. 30 and 31.

A maximum linewidth WM300 of the intercell connector 300 may be 2 mm to 3 mm, and a minimum linewidth WS300 of the intercell connector 300 may be 0.6 mm to 1 mm.

A length 300X1 of the intercell connector 300, in which the maximum linewidth WM300 is maintained, may be 5 mm to 7 mm. A length 300X2 of the intercell connector 300, in which a linewidth W300 of the intercell connector 300 increases or decreases, may be 1 mm to 1.5 mm. A length 300X3 of the intercell connector 300, in which the minimum linewidth WS300 is maintained, may be 3 mm to 3.5 mm.

As the intercell connector 300 according to the embodiment of the invention has the asymmetric planar shape based on the central line 300CL as described above, the shear stress generated in the first and second conductive lines 210 and 220 can be reduced.

So far, the embodiment of the invention described that the first conductive adhesive layer 251, the first and second conductive lines 210 and 220, and the intercell connector 300 each have an asymmetric pattern, by way of example. However, the implementation examples of each of the first conductive adhesive layer 251, the first and second conductive lines 210 and 220, and the intercell connector 300 may be combined and applied.

Figure 34:
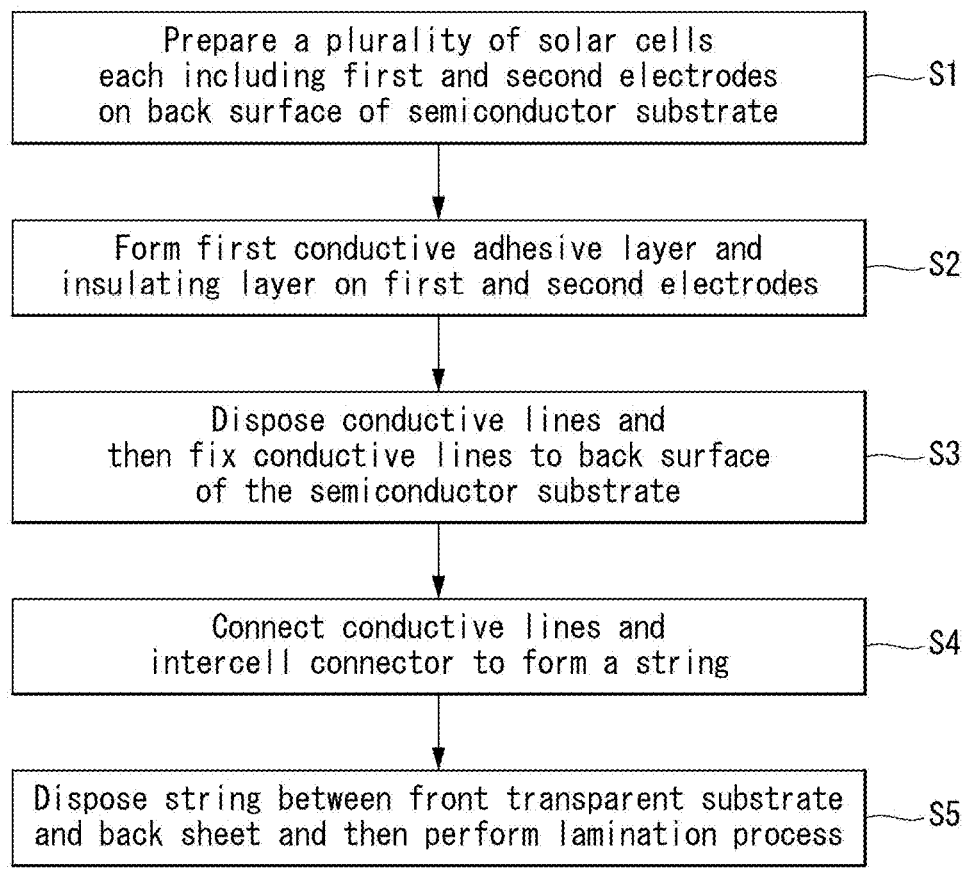
FIG. 34 illustrates an example of a method for manufacturing a solar cell module according to an embodiment of the invention.

FIG. 34 illustrates an example of a method for manufacturing a solar cell module according to the embodiment of the invention.

As shown in FIG. 34, a method for manufacturing a solar cell module according to the embodiment of the invention includes an operation S1 of preparing a plurality of solar cells, an operation S2 of forming a first conductive adhesive layer and an insulating layer, an operation S3 of disposing and fixing conductive lines, a string forming operation S4, and an operation S5 of performing a lamination process.

In the operation S1 of preparing the plurality of solar cells, as shown in FIGS. 4 and 5, a plurality of solar cells each including first and second electrodes 141 and 142, that are extended in the second direction y on a surface of a semiconductor substrate 110 and have different polarities, are provided.

In FIG. 34, each solar cell may be a back contact solar cell, in which all of the first and second electrodes 141 and 142 are formed on a back surface of the semiconductor substrate 110.

As described above, after the back contact solar cells are prepared, in the operation S2 of forming the first conductive adhesive layer and the insulating layer, a first conductive adhesive layer 251 may be applied to a portion of each of the first and second electrodes 141 and 142, and an insulating layer 252 may be formed.

A portion of each of the first and second electrodes 141 and 142, on which the first conductive adhesive layer 251 is formed, may be a crossing between a conductive line 200 and each of the first and second electrodes 141 and 142.

Accordingly, as shown in FIG. 25, the first conductive adhesive layer 251 may be applied to a crossing between the first electrode 141 and a first conductive line 210 and a crossing between the second electrode 142 and a second conductive line 220 in the back surface of the semiconductor substrate 110 and then may be dried.

Further, the insulating layer 252 may be applied to a crossing between the first electrode 141 and the second conductive line 220 and a crossing between the second electrode 142 and the first conductive line 210 and then may be cured.

Afterwards, in the operation S3 of disposing and fixing the conductive lines, as shown in FIG. 25, the conductive lines 200 may be disposed on a portion of each of the first and second electrodes 141 and 142, on which the first conductive adhesive layer 251 is positioned, and a portion of each of the first and second electrodes 141 and 142, on which the insulating layer 252 is positioned.

Hence, a disposition structure of the first conductive adhesive layers 251, the insulating layers 252, and the conductive lines 200 formed on the first and second electrodes 141 and 142 may be implemented as shown in FIG. 25.

In this instance, because the first conductive adhesive layer 251 and the insulating layer 252 have been already dried or cured, the conductive lines 200 may be in a state where they are not attached to the back surface of the semiconductor substrate 110.

Accordingly, the conductive lines 200 may be attached and fixed to the back surface of the semiconductor substrate 110 using an adhesive tape for the ease process of the solar cell module.

Afterwards, in the string forming operation S4, after the plurality of solar cells, to which the conductive lines 200 are attached, are arranged in the first direction x, the first conductive lines 210 of a first solar cell C1 among two adjacent solar cells and the second conductive lines 220 of a second solar cell C2 may be commonly connected to an intercell connector 300.

Hence, the first and second solar cells C1 and C2 may be connected in series to each other in the first direction x by the intercell connector 300.

However, the conductive lines 200 may be in a state where they are not yet electrically connected to the first and second electrodes 141 and 142 on the semiconductor substrate 110.

Afterwards, a plurality of strings may be disposed on a front encapsulant 20 in a state where the front encapsulant 20 is disposed on a front transparent substrate 10.

In this instance, the back surface of the semiconductor substrate 110 included in each string may be upwardly disposed, and a front surface of the semiconductor substrate 110 may contact the front encapsulant 20.

Afterwards, a back encapsulant 30 and a back sheet 40 may be sequentially disposed on the back surface of the semiconductor substrate 110.

In the operation S5 of performing the lamination process, the lamination process applying heat and pressure may be performed in a state where the plurality of solar cells are disposed between the front transparent substrate 10 and the back sheet 40.

The lamination process may be performed at any temperature between 160° C. and 170° C. For example, the lamination process may be performed at 165° C.

In the operation S5 of performing the lamination process, the sheet-type back encapsulant 30 may be softened and may completely adhere to back surfaces of the conductive lines 200, thereby physically contacting the conductive lines 200.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells arranged to be spaced apart from one another in a first direction, each of the plurality of solar cells including a semiconductor substrate, and a plurality of first electrodes and a plurality of second electrodes extended on a back surface of the semiconductor substrate in a second direction crossing the first direction;
a plurality of first conductive lines and a plurality of second conductive lines extended on the back surface of the semiconductor substrate of each of the plurality of solar cells in the first direction, the plurality of first conductive lines being connected to the plurality of first electrodes at crossings between the plurality of first electrodes and the plurality of first conductive lines through a plurality of first conductive adhesive layers, the plurality of second conductive lines being connected to the plurality of second electrodes at crossings between the plurality of second electrodes and the plurality of second conductive lines through the plurality of first conductive adhesive layers; and
an intercell connector extended between a first solar cell and a second solar cell, that are disposed adjacent to each other among the plurality of solar cells, in the second direction, the plurality of first conductive lines connected to the first solar cell and the plurality of second conductive lines connected to the second solar cell being commonly connected to the intercell connector through a second conductive adhesive layer,
wherein at least one of the plurality of first conductive adhesive layers, the plurality of first conductive lines, the plurality of second conductive lines, and the intercell connector has an asymmetric pattern wherein a planar shape of the intercell connector has a zigzag shape, and wherein the zigzag shape of the intercell connector is configured such that one side of the intercell connector protrudes based on a central line of the intercell connector parallel to the second direction and the other side is depressed based on the central line of the intercell connector parallel to the second direction when viewed from a plane of the intercell connector.

2. The solar cell module of claim 1, wherein as at least some of the plurality of first conductive adhesive layers go along a longitudinal direction of the plurality of first conductive lines and the plurality of second conductive lines, the at least some of the plurality of first conductive adhesive layers have an asymmetric pattern based on a central line of each of the plurality of first conductive lines and the plurality of second conductive lines.

3. The solar cell module of claim 2, wherein each of the plurality of first conductive adhesive layers includes first and second edges respectively positioned at both ends in the second direction, and
wherein the first edge of each of the at least some first conductive adhesive layers is positioned inside an overlap area between the plurality of first conductive lines and the plurality of second conductive lines with the at least some of the plurality of first conductive adhesive layers, and the second edge of each of the at least some first conductive adhesive layers is positioned outside the overlap area.

4. The solar cell module of claim 3, wherein as the at least some of the plurality of first conductive adhesive layers go along the longitudinal direction of the plurality of first conductive lines and the plurality of second conductive lines, the at least some of the plurality of first conductive adhesive layers are disposed in a zigzag shape based on the central line of each of the plurality of first conductive lines and the plurality of second conductive lines.

5. The solar cell module of claim 3, wherein a second direction length of each of the at least some of the plurality of first conductive adhesive layers is less than a linewidth of each of the plurality of first conductive lines and the plurality of second conductive lines, and
wherein a first direction width of each of the at least some of the plurality of first conductive adhesive layers is less than the second direction length of the at least some first conductive adhesive layers.

6. The solar cell module of claim 5, wherein a second direction length of remaining first conductive adhesive layers except the at least some of the plurality of first conductive adhesive layers from the plurality of first conductive adhesive layers is greater than the linewidth of each of the plurality of first conductive lines and the plurality of second conductive lines, and
wherein both edges of each of the remaining first conductive adhesive layers in the second direction are positioned outside an overlap area between the plurality of first conductive lines and the plurality of second conductive lines with the remaining first conductive adhesive layers.

7. The solar cell module of claim 6, wherein the at least some of the plurality of first conductive adhesive layers and the remaining first conductive adhesive layers are alternately positioned along the longitudinal direction of the plurality of first conductive lines and the plurality of second conductive lines.

8. The solar cell module of claim 6, wherein the remaining first conductive adhesive layers are positioned in an edge portion of the semiconductor substrate, and
wherein the at least some of the plurality of first conductive adhesive layers are positioned in a middle portion of the semiconductor substrate.

9. The solar cell module of claim 1, wherein each of the plurality of first conductive lines and the plurality of second conductive lines is asymmetric with respect to both sides of a first direction central axis of each of the plurality of first conductive lines and the plurality of second conductive lines.

10. The solar cell module of claim 9, wherein the plurality of first conductive lines have a uniform linewidth and has an asymmetric shape with respect to both sides of the first direction central axis of the plurality of first conductive lines, and
wherein the plurality of second conductive lines have a uniform linewidth and has an asymmetric shape with respect to both sides of the first direction central axis of the plurality of second conductive lines.

11. The solar cell module of claim 10, wherein each of the plurality of first conductive lines and the plurality of second conductive lines has a zigzag shape with respect to both sides of the first direction central axis of each of the plurality of first conductive lines and the plurality of second conductive lines.

12. The solar cell module of claim 11, wherein each of the plurality of first conductive lines and the plurality of second conductive lines having the zigzag shape includes a hole.

13. The solar cell module of claim 9, wherein each of the plurality of first conductive lines and the plurality of second conductive lines includes a hole, and a position or a shape of the hole is asymmetric based on the first direction central axis.

14. The solar cell module of claim 9, wherein a width of each of the plurality of first conductive lines and the plurality of second conductive lines periodically increases or decreases along the first direction.

15. The solar cell module of claim 1, wherein the plurality of first conductive lines are connected to the plurality of first electrodes at crossings between the plurality of first conductive lines and the plurality of first electrodes through the plurality of first conductive adhesive layers and are insulated from the plurality of second electrodes at crossings between the plurality of first conductive lines and the plurality of second electrodes through an insulating layer, and
wherein the plurality of second conductive lines are connected to the plurality of second electrodes at crossings between the plurality of second conductive lines and the plurality of second electrodes through the plurality of first conductive adhesive layers and are insulated from the plurality of first electrodes at crossings between the plurality of second conductive lines and the plurality of first electrodes through the insulating layer.

16. The solar cell module of claim 10, wherein an end of each of the plurality of first conductive lines and the plurality of second conductive lines protruding to an outside of a projection area of the semiconductor substrate includes a bent portion bending in a third direction crossing the first and second directions.

17. The solar cell module of claim 16, wherein the bent portion of each of the plurality of first conductive lines and the plurality of second conductive lines is positioned between the semiconductor substrate of each of the first and second solar cells and the intercell connector.

18. The solar cell module of claim 17, wherein the bent portion of each of the plurality of first conductive lines and the plurality of second conductive lines protrudes toward a back surface of the solar cell module.

19. The solar cell module of claim 1, wherein the planar shape of the intercell connector has an asymmetric shape based on the central line of the intercell connector parallel to the second direction.

20. The solar cell module of claim 1, wherein a first side of the intercell connector of the zigzag shape next to the first solar cell in the first connection portion protrudes toward the first solar cell, and a second side of the intercell connector next to the second solar cell is depressed toward the central line, and
wherein the second side of the intercell connector in the second connection portion protrudes toward the second solar cell, and the first side of the intercell connector is depressed toward the central line.

21. The solar cell module of claim 1, wherein the semiconductor substrate of each of the first solar cell and the second solar cell is doped with impurities of a first conductive type,
wherein the plurality of first electrodes are positioned on the back surface of the semiconductor substrate and are connected to an emitter region, that is doped with impurities of a second conductive type opposite the first conductive type, and
wherein the plurality of second electrodes are positioned on the back surface of the semiconductor substrate and are connected to a back surface field region, that is more heavily doped than the semiconductor substrate with the impurities of the first conductive type.

22. A solar cell module comprising:
a plurality of solar cells each including a semiconductor substrate, and a plurality of first electrodes and a plurality of second electrodes having different polarities and being extended on the semiconductor substrate in a second direction;
a plurality of first conductive lines and a plurality of second conductive lines connected to each solar cell and extended in a first direction crossing the plurality of first electrodes and the plurality of second electrodes, the plurality of first conductive lines being connected to the plurality of first electrodes while overlapping the plurality of first electrodes, the plurality of second conductive lines being connected to the plurality of second electrodes while overlapping the plurality of second electrodes; and
an intercell connector extended between first and second solar cells, that are disposed adjacent to each other among the plurality of solar cells, in the second direction, the plurality of first conductive lines connected to the first solar cell and the plurality of second conductive lines connected to the second solar cell being commonly connected to the intercell connector,
wherein the intercell connector is spaced apart from the semiconductor substrate of each of the first solar cell and the second solar cell, and
wherein a distance between a first side of the intercell connector positioned on the same line as a connection portion of the intercell connector, to which one of the plurality of first conductive lines and the plurality of second conductive lines connected to the first solar cell and the second solar cell is connected, and the semiconductor substrate of the first solar cell is different from a distance between a second side of the intercell connector positioned opposite the first side and the semiconductor substrate of the second solar cell wherein a planar shape of the intercell connector has a zigzag shape, and wherein the zigzag shape of the intercell connector is configured such that one side of the intercell connector protrudes based on a central line of the intercell connector parallel to the second direction and the other side is depressed based on the central line of the intercell connector parallel to the second direction when viewed from a plane of the intercell connector.

23. The solar cell module of claim 22, wherein a first connection portion of the intercell connector, to which the plurality of first conductive lines of the first solar cell are connected, is positioned closer to the distance between the first side of the intercell connector and the semiconductor substrate of the first solar cell than the distance between the second side of the intercell connector and the semiconductor substrate of the second solar cell, and
wherein a second connection portion of the intercell connector, to which the plurality of second conductive lines of the second solar cell are connected, is positioned closer to the distance between the second side of the intercell connector and the semiconductor substrate of the second solar cell than the distance between the first side of the intercell connector and the semiconductor substrate of the first solar cell.

24. A solar cell module comprising:
a plurality of solar cells arranged to be spaced apart from one another in a first direction, each solar cell including a semiconductor substrate, and a plurality of first electrodes and a plurality of second electrodes extended on a back surface of the semiconductor substrate in a second direction crossing the first direction; and
a plurality of first and second conductive lines extended on the back surface of the semiconductor substrate of each of the plurality of solar cells in the first direction, the plurality of first conductive lines being connected to the plurality of first electrodes at crossings between the plurality of first electrodes and the plurality of first conductive lines through a plurality of first conductive adhesive layers, the plurality of second conductive lines being connected to the plurality of second electrodes at crossings between the plurality of second electrodes and the plurality of second conductive lines through the plurality of first conductive adhesive layers,
wherein each of the plurality of first conductive adhesive layers includes first and second edges respectively positioned at both ends in the second direction, and
wherein the first edge of each of at least some of the plurality of first conductive adhesive layers is positioned inside an overlap area between the plurality of first conductive lines and the plurality of second conductive lines with the at least some of the plurality of first conductive adhesive layers, and the second edge of each of the at least some of the plurality of first conductive adhesive layers is positioned outside the overlap area.

25. The solar cell module of claim 24, wherein each of the at least some of the plurality of first conductive adhesive layers is divided in the second direction at crossings between the plurality of first electrodes and the plurality of first conductive lines and crossings between the plurality of second electrodes and the plurality of second conductive lines to form a plurality of first conductive adhesive layers.

26. The solar cell module of claim 25, wherein the first edge of each of the plurality of first conductive adhesive layers, that are spaced apart from one another in the second direction at the crossings between the plurality of first electrodes and the plurality of first conductive lines and the crossings between the plurality of second electrodes and the plurality of second conductive lines, is positioned inside an overlap area between the plurality of first conductive lines and the plurality of second conductive lines with the plurality of first conductive adhesive layers, and the second edge of each of the plurality of first conductive adhesive layers is positioned outside the overlap area.

27. The solar cell module of claim 26, wherein a separate first conductive adhesive layer is positioned between the plurality of first conductive adhesive layers, that are spaced apart from one another in the second direction at the crossings between the plurality of first electrodes and the plurality of first conductive lines and the crossings between the plurality of second electrodes and the plurality of second conductive lines, and is spaced apart from the plurality of first conductive adhesive layers, and wherein both edges of the separate first conductive adhesive layer are positioned inside the overlap area.

* * * * *